(12) United States Patent
Hosokawa et al.

(10) Patent No.: US 8,229,987 B2
(45) Date of Patent: Jul. 24, 2012

(54) DISCRETE TIME DIRECT SAMPLING CIRCUIT AND RECEIVER

(75) Inventors: Yoshifumi Hosokawa, Osaka (JP); Katsuaki Abe, Osaka (JP); Noriaki Saito, Tokyo (JP); Kiyomichi Araki, Saitama (JP); Yohei Morishita, Kanagawa (JP)

(73) Assignee: Panasonic Corporation, Osaka (JP)

( * ) Notice: Subject to any disclaimer, the term of this patent is extended or adjusted under 35 U.S.C. 154(b) by 950 days.

(21) Appl. No.: 12/281,668

(22) PCT Filed: Mar. 5, 2007

(86) PCT No.: PCT/JP2007/054169
§ 371 (c)(1),
(2), (4) Date: Sep. 4, 2008

(87) PCT Pub. No.: WO2007/102459
PCT Pub. Date: Sep. 13, 2007

(65) Prior Publication Data
US 2009/0009155 A1   Jan. 8, 2009

(30) Foreign Application Priority Data

Mar. 7, 2006  (JP) ................................. 2006-061914
May 30, 2006  (JP) ................................. 2006-150511
Feb. 5, 2007  (JP) ................................. 2007-025745

(51) Int. Cl.
*G06F 17/17* (2006.01)
*G06G 7/28* (2006.01)
*H03M 1/00* (2006.01)

(52) U.S. Cl. .......................... 708/313; 708/847; 341/122

(58) Field of Classification Search .................. 708/313, 708/847; 341/122–125
See application file for complete search history.

(56) References Cited

U.S. PATENT DOCUMENTS

| 7,539,721 B2 * | 5/2009 | Belveze et al. ............... 708/819 |
| 2003/0035499 A1 | 2/2003 | Staszewski et al. |
| 2003/0050027 A1 * | 3/2003 | Muhammad et al. ......... 455/257 |
| 2006/0164160 A1 * | 7/2006 | Muhammad et al. ......... 327/552 |

OTHER PUBLICATIONS

Staszewski et al., "All-digital TX frequency synthesizer and discrete-time receiver for Bluetooth radio in 130-nm CMOS," IEEE Journal of Solid-State Circuits, vol. 39, No. 12, pp. 2284-2287, Dec. 2004.
K. Muhammad et al., "A discrete-time Bluetooth receiver in a 013μm digital CMOS process ", 2004 IEEE International Solid-State Circuits Conference, Feb. 2004, Paper 15.1.
Robert Bogdan et al., "All-Digital TX Frequency Synthesizer and Discrete-Time Receiver for Bluetooth Radio in 130-nm CMOS ", IEEE Journal of Solid-State Circuits, vol. 39, No. 12, Dec. 2004.

* cited by examiner

*Primary Examiner* — Chuong D Ngo
(74) *Attorney, Agent, or Firm* — Greenblum & Bernstein, P.L.C.

(57) ABSTRACT

A direct sampling circuit and a receiver which carry out discrete time analog processing with a high degree of design freedom and are provided with a filter property which is achievable to comply with the receipt of a broad band signal. A plurality of discrete time analog processing circuits (101) are connected in parallel with each other, a gm value and a capacitance of a capacitor in each circuit system are set independently based on a prescribed condition, and an output signal obtained from each circuit system is synthesized by means of a buffer capacitor (102), so that an equivalently high-dimensional IIR filter can be put into practice.

14 Claims, 24 Drawing Sheets

PRIOR ART

US 8,229,987 B2

DISCRETE TIME DIRECT SAMPLING CIRCUIT AND RECEIVER

TECHNICAL FIELD

The present invention relates to a sampling circuit and receiver, and more particularly to a technology that performs received signal processing such as frequency conversion by means of discrete time analog processing, filter processing and so forth.

BACKGROUND ART

A configuration has been disclosed that performs reception processing by means of direct discrete time sampling of a high-frequency signal with the aim of achieving small size and low power consumption of a receiver and integrating the analog signal processing section and digital signal processing section (see Non-patent Document 1 and Patent Document 1, for example).

An example of the configuration and operation of a discrete time direct sampling circuit that uses conventional discrete time processing is described below using FIG. 1. Overall, FIG. 1 shows a discrete time filter sampling circuit. The discrete time direct sampling circuit is provided with voltage-to-current converter (TA) 1, sampling switch 2, history capacitor ($C_H$) 3, rotation capacitor group 4a through 4h, buffer capacitor ($C_B$) 5, damping switch 6, reset switch 7, integration switch group 8a through 8h, discharge switch group 9a through 9h, and digital control unit 10.

Voltage-to-current converter (TA) 1 converts a received radio frequency (RF) signal to a current, and outputs it as an analog RF current signal. Sampling switch 2 is composed of an FET, for example, and samples an input analog RF current signal according to local frequency signal input (LO). History capacitor ($C_H$) 3 charges a charge supplied by a current output from sampling switch 2. Rotation capacitor group 4a through 4h is connected in parallel to history capacitor 3 and buffer capacitor 5 via a plurality of kinds of switches, and is configured by means of a plurality of rotation capacitors ($C_R$) that charge or discharge a charge according to on/off control of the switches. Buffer capacitor ($C_B$) 5 is connected in common to the charges charged by the plurality of rotation capacitors 4, and buffers a charge signal. Damping switch 6 switches the connections between rotation capacitors 4a through 4h and buffer capacitor 5 on and off. Reset switch 7 grounds the charges accumulated in rotation capacitors 4 after charge sharing with buffer capacitor 5. Integration switch group 8a through 8h is composed of a plurality of integration switches, and switches the connections between history capacitor 3 and the rotation capacitors in rotation capacitor group 4a through 4h on and off. Discharge switch group 9a through 9h is composed of a plurality of discharge switches, and switches the connections between the rotation capacitors in rotation capacitor group 4a through 4h and buffer capacitor 5 on and off.

Damping switch 6, reset switch 7, integration switch group 8a through 8h, and discharge switch group 9a through 9h, are configured by means of FETs (n-type), for example. An n-type FET is turned on (energized) when the gate voltage is high, and turned off (shut off) when the gate voltage is low.

Digital control unit 10 generates and supplies control signals to integration switch group 8a through 8h, discharge switch group 9a through 9h, damping switch 6, and reset switch 7.

As an example, a case is assumed here in which eight rotation capacitors $C_R$ are provided, and eight integration switches 8a through 8h and eight discharge switches 9a through 9h are provided accordingly, with letters "a" through "h" appended in alphabetical order to the respective configuration element numbers. Actually, it is also possible to use a configuration that performs differential operation, and such a configuration is disclosed in Patent Document 1, but a description of this configuration is omitted here for the sake of brevity.

FIG. 2 shows a timing chart of the control signals generated by digital control unit 10. A local frequency signal (LO) is supplied to the gate of sampling switch 2. Control signals S1 through S8 are supplied to integration switches 8a through 8h respectively. Control signal SAZ is supplied to the gates of discharge switches 9a through 9d, and control signal SBZ is supplied to the gates of discharge switches 9e through 9h. Control signal D is supplied to the gate of damping switch 6, and control signal R is supplied to the gate of reset switch 7.

The operation of the discrete time direct sampling circuit shown in FIG. 1 will now be described. Voltage-to-current converter 1 converts an input analog RF signal to an analog RF current signal, and outputs this signal to sampling switch 2. The analog RF current signal is sampled at sampling switch 2 by means of local frequency signal LO having virtually the same frequency as the analog RF current signal, and is made temporally discrete discretized signals by having the charges integrated by history capacitor 3 and rotation capacitors 4a through 4h.

The discrete signals are integrated over a time period longer than the local frequency signal LO clock by a capacitor configured by means of history capacitor 3 and one of rotation capacitor group 4a through 4h connected in parallel. By this means, filter processing and decimation are performed.

Specifically, first, integration switch 8a is turned on by control signal S1, rotation capacitor 4a is connected to history capacitor 3, and the charge applied to the aforementioned two capacitors is integrated over a time period during which control signal S1 is high (for example, eight cycles of local frequency signal LO).

When control signal S1 goes low, the connection of history capacitor 3 to rotation capacitor 4a is turned off, and connection to rotation capacitor 4b is turned on by means of control signal S2. Rotation capacitor 4b integrates a charge supplied by the discrete signal current over a period during which control signal S2 is high, and then turns off the connection to history capacitor 3. Similarly, rotation capacitors 4c through 4h are connected in turn to history capacitor 3 for eight local frequency signal LO cycles each by means of control signals S3 through S8, and the charge supplied by the discrete signal current is integrated by the two capacitors.

In this way, the charges supplied by the currents of discrete signals equivalent to eight local frequency signal LO cycles are integrated, and an 8-tap FIR (Finite Impulse Response) filter characteristic is realized. Also, since a one-sample charge amount is obtained by integrating signals for eight local frequency signal LO cycles, the sampling rate is decimated to ⅛. The functional section that realizes this filter characteristic will be referred to as a first FIR filter.

Also, an IIR (Infinite Impulse Response) filter characteristic is realized by rotation capacitors 4a through 4h being connected in turn to history capacitor 3. The functional section that realizes this filter characteristic will be referred to as a first IIR filter.

Next, by having discharge switches 9a through 9d turned on by control signal SAZ, conduction is effected between rotation capacitors 4a through 4d and buffer capacitor 5, and the charges charged by rotation capacitors 4a through 4d are shared with buffer capacitor 5. As a result, part of the charges of rotation capacitors 4a through 4d respectively moves to buffer capacitor 5, and the charge amounts are combined. After charge sharing between rotation capacitors 4a through 4d and buffer capacitor 5, damping switch 6 is turned off by control signal D, and the charge sharing state is terminated. Then reset switch 7 is turned on by control signal R, and charges remaining in rotation capacitors 4a through 4d are reset by grounding.

In this way, a 4-tap FIR filter characteristic is realized by part of charges charged in rotation capacitors 4a through 4d moving to buffer capacitor 5 and being combined. As digital signals equivalent to four samples are combined and a one-sample digital signal is output, the sampling rate is decimated to ¼.

For rotation capacitors 4e through 4h, similarly, discharge switches 9e through 9h are turned on by control signal SBZ, and part of the charge charged in each rotation capacitor is shared with buffer capacitor 5, whereby 4-tap FIR filter processing and ¼ decimation are performed. This filter characteristic will be referred to as a second FIR filter.

Also, an IIR filter characteristic is realized by placing the rotation capacitor 4a through 4d and 4e through 4h groups alternately in a charge sharing state with buffer capacitor 5. This filter effect will be referred to as a second IIR filter.

FIG. 3 shows filter characteristics when the frequency of local frequency signal LO is 2.4 GHz, the capacitance of history capacitor 3 is 15 pF, the capacitance of each of rotation capacitors 4a through 4h is 0.5 pF, the capacitance of buffer capacitor 5 is 15 pF, and the transconductance of voltage-to-current converter 1 is 7.5 mS. FIG. 3A shows the characteristic of the first FIR filter, FIG. 3B the characteristic of the first IIR filter, FIG. 3C the characteristic of the second FIR filter, FIG. 3D the characteristic of the second IIR filter, FIG. 3E the characteristic of the overall discrete time direct sampling circuit, and FIG. 3F a magnification of the characteristic in FIG. 3E in the frequency range in the vicinity of 2.4 GHz. DC gain has been normalized at 0 dB.

As described above, a discrete time direct sampling circuit outputs a signal for which filter processing with a characteristic combining the characteristics of a first FIR filter, first IIR filter, second FIR filter, and second FIR filter has been executed is output to a later-stage circuit.

Patent Document 1: US Patent Application Laid-Open No. 2003/0035499 Specification, "Direct Radio Frequency Sampling with Recursive Filtering Method"

Non-patent Document 1: R. B. Staszewski et al, "All-Digital TX Frequency Synthesizer and Discrete-Time Receiver for Bluetooth Radio in 130n-nm CMOS", IEEE Journal of Solid-State Circuits, VOL. 39, No. 12, December 2004 (pp 2284-2287, FIG. 12-FIG. 16)

DISCLOSURE OF INVENTION

Problems to be Solved by the Invention

However, with the above conventional technology, there are problems such as described below.

Namely, with a conventional discrete time direct sampling circuit such as shown in FIG. 1, filtering that can be realized by the first IIR filter and second IIR filter has a first-order characteristic, and there is therefore a problem of not being able to obtain an adequate frequency response characteristic when this circuit is applied to a wideband radio communication system. Specifically, if a circuit in which the kind of characteristic shown in FIG. 3F is realized is applied to a radio communication system in which the received signal bandwidth is 2 MHz, for example, and there is a signal of an adjacent channel or another interference wave in the vicinity of the received signal band, the interference wave signal cannot be adequately attenuated, and gain fluctuation will occur in the received signal band.

Also, with the configuration shown in FIG. 1, the only circuit element values contributing to filter frequency response characteristic changes in the discrete time direct sampling circuit are three kinds of capacitance values—those of history capacitor 3, rotation capacitors 4a through 4h, and buffer capacitor 5. Therefore, characteristics that can be obtained by changing these are limited, and there is thus a problem of the degree of design freedom not being high. For example, if it is wished to realize a frequency response characteristic that will secure a larger amount of attenuation to eliminate an above-described interference wave in the vicinity of the receive channel band, this can be achieved by setting a higher ratio between the capacitance values of history capacitor 3 and rotation capacitors 4a through 4h, but a characteristic with still greater gain fluctuation in the received signal band will thus be obtained. Conversely, if an attempt is made to reduce gain fluctuation in the received signal band, it will not be possible to secure an amount of attenuation to deal with an interference wave. This kind of trade-off is thus a further problem.

The present invention provides a direct sampling circuit and receiver using discrete time analog processing that are capable of realizing an improvement in a filter characteristic that can be applied to reception of a wideband signal and the degree of design freedom.

Means for Solving the Problems

A discrete time direct sampling circuit of the present invention employs a configuration having: a discrete time analog processing circuit group in which a plurality of discrete time analog processing circuit systems having a first-order IIR filter characteristic are connected in parallel; an output section that is provided on the output side of the discrete time analog processing circuit group, and has a buffer capacitor, and a damping switch that performs on/off control of the connection state of the plurality of discrete time analog processing circuits connected in parallel and the buffer capacitor; and a digital control unit that sends a control signal to each discrete time analog processing circuit and the output section.

Advantageous Effect of the Invention

According to the present invention, by providing a plurality of discrete time analog processing circuit systems it becomes possible to increase the types of settable parameters and to realize a filter frequency response characteristic that could not be realized heretofore. By this means, in concrete terms, it becomes possible to suppress gain fluctuation in the received signal pass band, or to improve the amount of attenuation of a frequency region for which the inclusion of an interference wave should be prevented, and thus improve the degree of design freedom of a frequency response characteristic.

BEST MODE FOR CARRYING OUT THE INVENTION

Embodiments of the present invention will now be described in detail with reference to the accompanying drawings.

Embodiment 1

Figure 4:
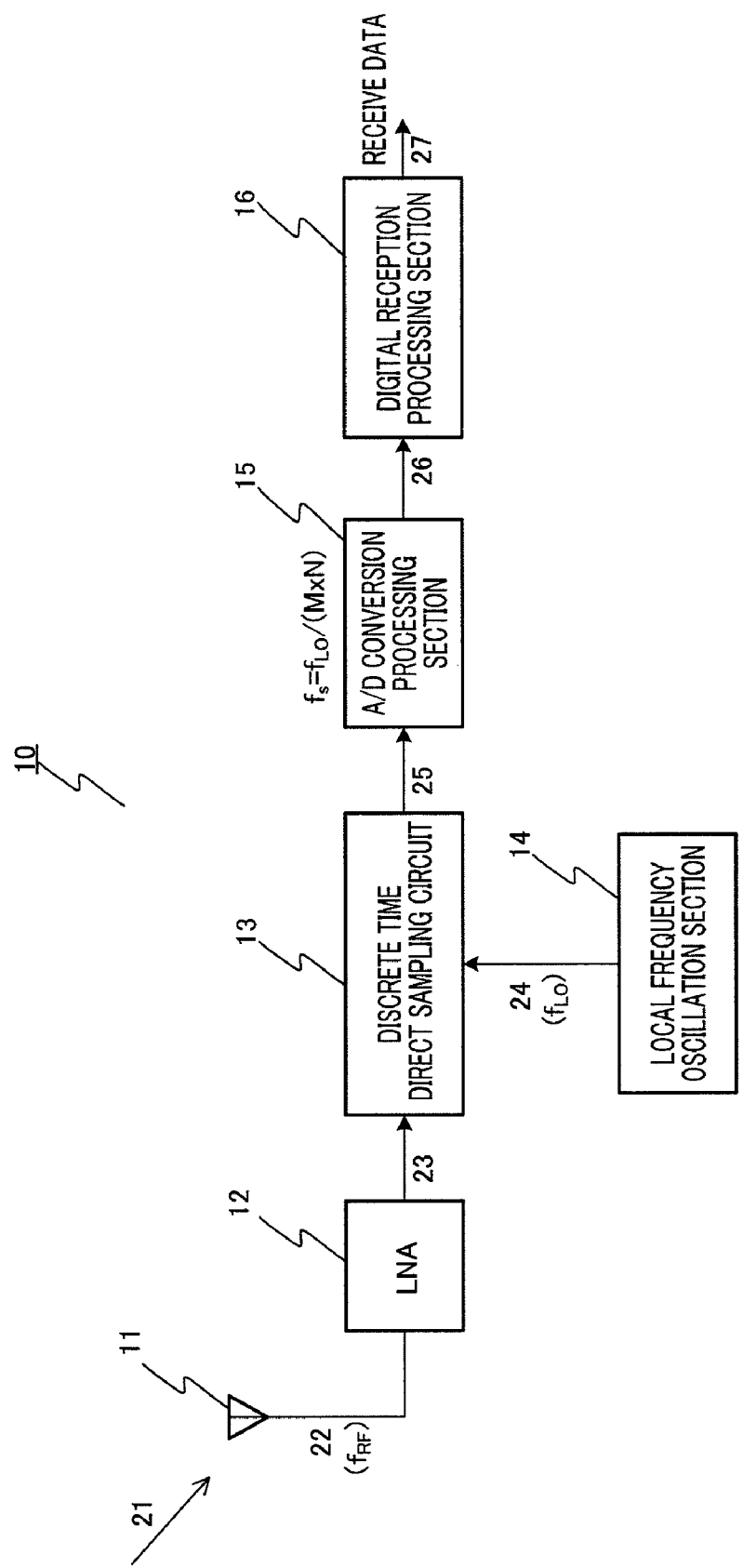
FIG. 4 is a block diagram showing the configuration of a discrete time direct sampling receiver according to Embodiment 1 of the present invention.

FIG. 4 shows the configuration of a discrete time direct sampling receiver of this embodiment. Discrete time direct sampling receiver 10 receives electromagnetic wave 21 transmitted at carrier frequency $f_{RF}$, executes discrete temporal frequency conversion and filter processing on this received signal and extracts a desired signal component, and then converts the signal to a digital signal and performs digital reception processing, and outputs obtained receive data 27. Discrete time direct sampling receiver 10 has antenna 11, low noise amplifier (LNA) 12, discrete time direct sampling circuit 13, local frequency oscillation section 14, analog/digital (A/D) conversion processing section 15, and digital reception processing section 16.

Antenna 11 receives electromagnetic wave 21 transmitted from a transmitting station (not shown) at carrier frequency $f_{RF}$, and converts it to analog RF signal 22. Low noise amplifier 12 amplifies analog RF signal 22 and outputs the amplified signal.

Discrete time direct sampling circuit 13 has amplified analog RF signal 23 and local frequency signal 24 as input, and outputs baseband signal 25 resulting from extracting only a desired signal component by performing discrete temporal frequency conversion and filter processing on analog RF signal 23.

Local frequency oscillation section 14 generates and outputs local frequency signal 24 used in sampling processing and frequency conversion processing to discrete time direct sampling circuit 13. Analog/digital conversion processing section 15 quantizes an input baseband signal to a digital value at a predetermined sampling frequency, and outputs converted digital baseband signal 26. Digital reception processing section 16 performs predetermined digital reception processing such as demodulation processing and decoding processing using the input digital baseband signal, and outputs receive data 27 obtained thereby.

Figure 5:
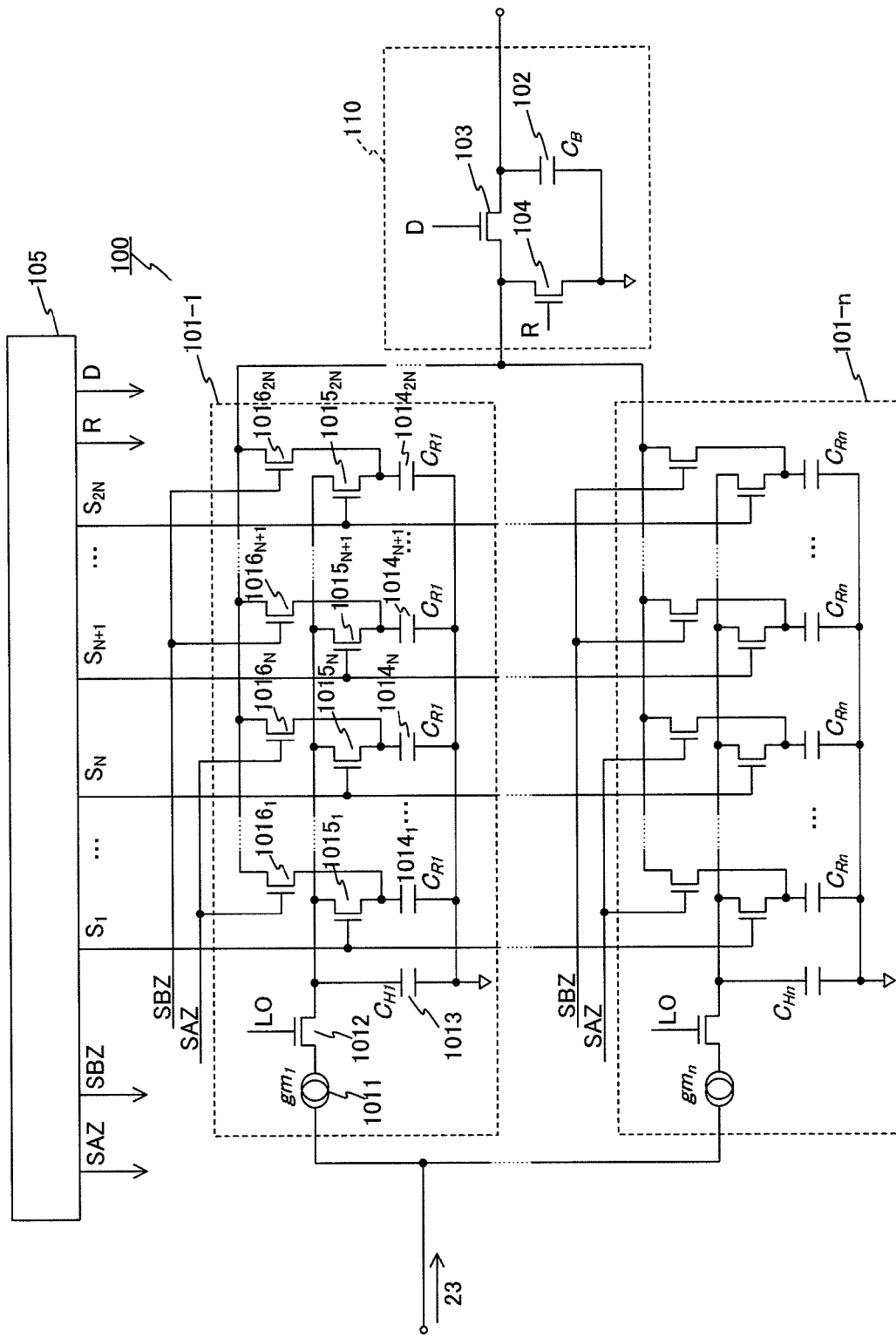
FIG. 5 is a connection diagram showing the configuration of a discrete time direct sampling circuit of Embodiment 1.

In FIG. 5, reference code 100 denotes the overall configuration of a discrete time direct sampling circuit of this embodiment. That is to say, reference code 100 denotes the actual configuration of discrete time direct sampling circuit 13 in FIG. 4.

Discrete time direct sampling circuit 100 has an array of a plurality of circuits performing discrete time analog processing on an input signal, and by independently setting circuit element values in each system, enables a better filter frequency response characteristic to be obtained than with a conventional circuit comprising a single system.

Discrete time direct sampling circuit 100 broadly comprises a discrete time analog processing circuit group in which a plurality of discrete time analog processing circuit systems 101-1 through 101-$n$ are connected in parallel, output section 110, and digital control unit 105. Output section 110 has buffer capacitor 102, damping switch 103 that performs on/off control of the connection state between plurality of parallel-connected discrete time analog processing circuits 101-1 through 101-$n$ and buffer capacitor 102, and reset switch 104 for grounding the output of discrete time analog processing circuits 101-1 through 101-$n$. Digital control unit 105 sends control signals to discrete time analog processing circuits 101-1 through 101-$n$, damping switch 103, and reset switch 104.

Figure 1:
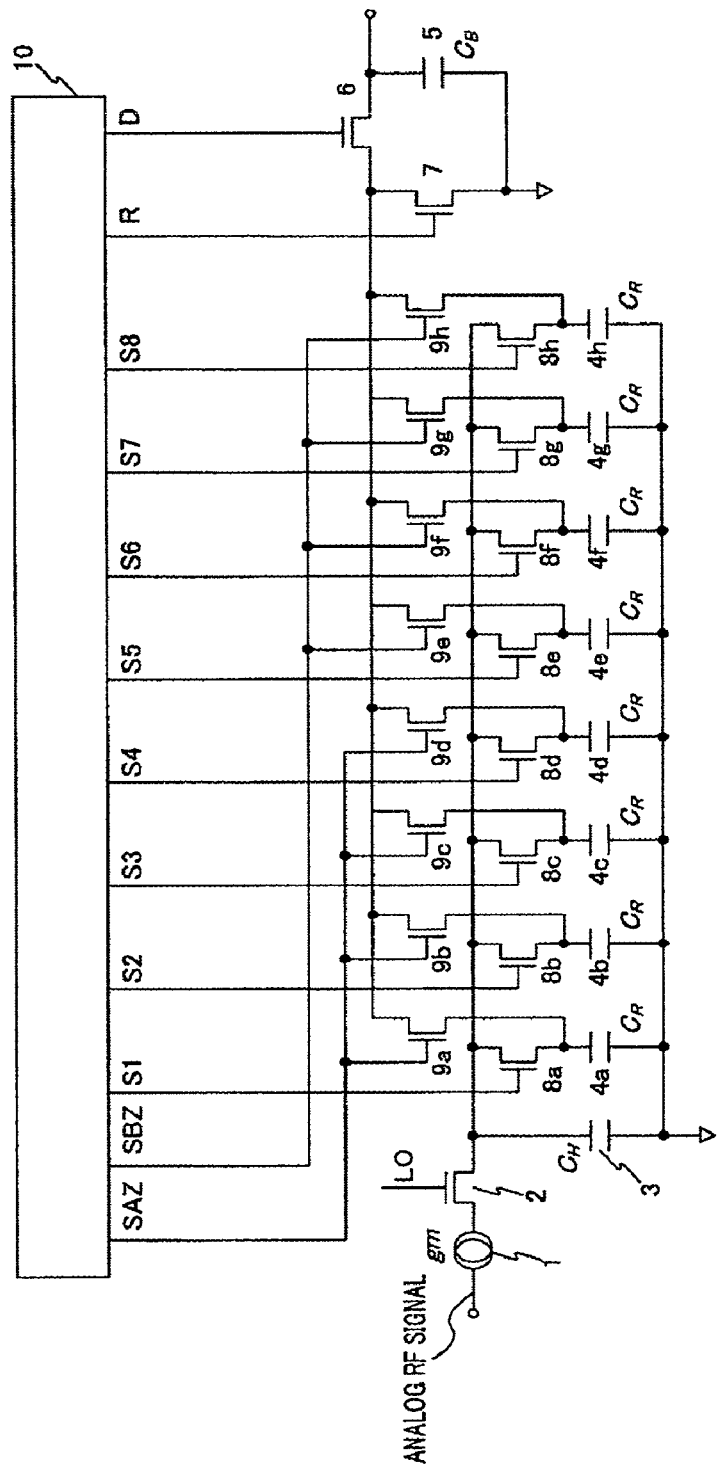
FIG. 1 is a connection diagram showing an example of the configuration of a conventional discrete time direct sampling circuit.
Figure 2:
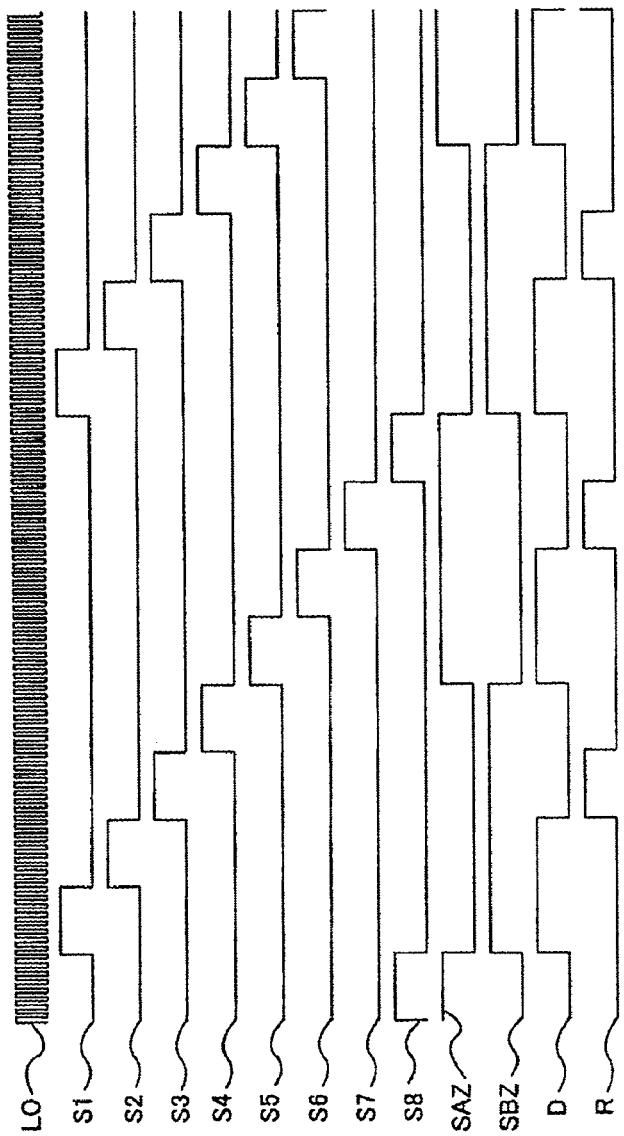
FIG. 2 is a timing chart provided to explain control signals in a conventional discrete time direct sampling circuit.
Figure 3A:
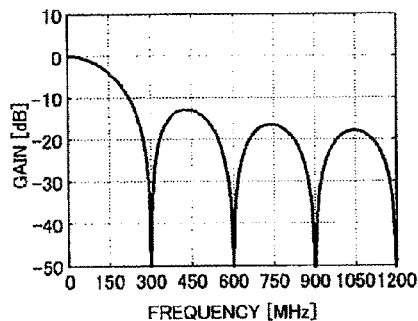
FIG. 3 comprises characteristic graphs showing examples of filter characteristics realized by a conventional discrete time direct sampling circuit.
Figure 3B:
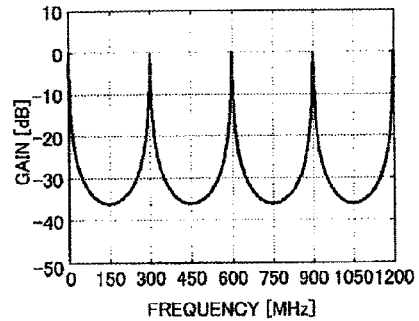
Figure 3C:
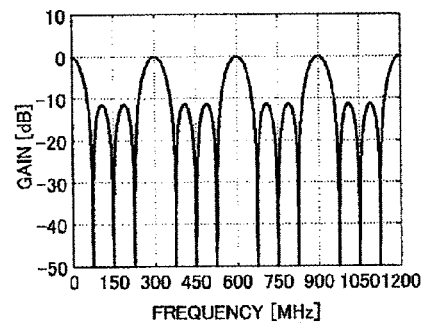
Figure 3D:
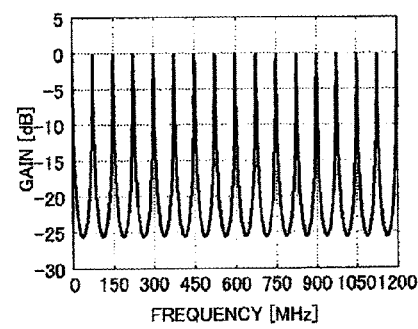
Figure 3E:
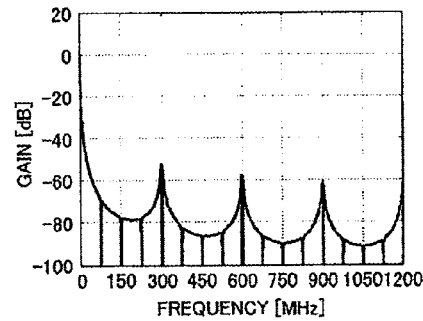
Figure 3F:
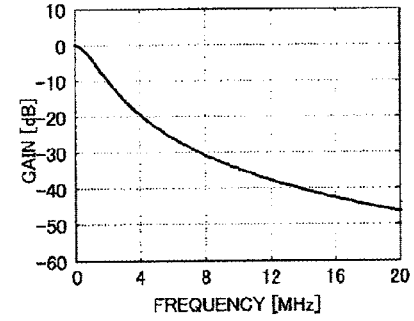

Each of discrete time analog processing circuits 101-1 through 101-$n$ has voltage-to-current converter 1011, sampling switch 1012, history capacitor 1013, rotation capacitor group $1014_1$ through $1014_{2N}$, integration switch group $1015_1$ through $1015_{2N}$, and discharge switch group $1016_1$ through $1016_{2N}$, which perform the same kind of operations as indicated by the same configuration element names in FIG. 1. Here, the gm value (transconductance) of voltage-to-current converter 1011 in each of discrete time analog processing circuits 101-1 through 101-n, and the capacitance values in history capacitor 1013 and rotation capacitor group $1014_1$ through $1014_{2N}$, are set to different values based on a derivative expression given later herein.

In the configuration shown in FIG. 5, the number of rotation capacitors making up rotation capacitor group $1014_1$ through $1014_{2N}$ in each of discrete time analog processing circuits 101-1 through 101-n, the number of integration switches making up integration switch group $1015_1$ through $1015_{2N}$, and the number of discharge switches making up discharge switch group $1016_1$ through $1016_{2N}$, is 2×N. To distinguish between each of the 2×N rotation capacitors, integration switches, and discharge switches, a number from 1 to 2N is appended to each reference number.

Buffer capacitor 102, damping switch 103, and reset switch 104 also perform the same kind of operations as the items indicated by the same configuration element names in FIG. 1.

In this embodiment, capacitors used for feedback control and their control signals in the configuration disclosed in Non-patent Document 1 are not restricted by the present invention, and descriptions and illustrations thereof are omitted in order to simplify the description.

Digital control unit 105 generates and supplies control signals to integration switch group $1015_1$ through $1015_{2N}$ and discharge switch group $1016_1$ through $1016_{2N}$.

Figure 6:
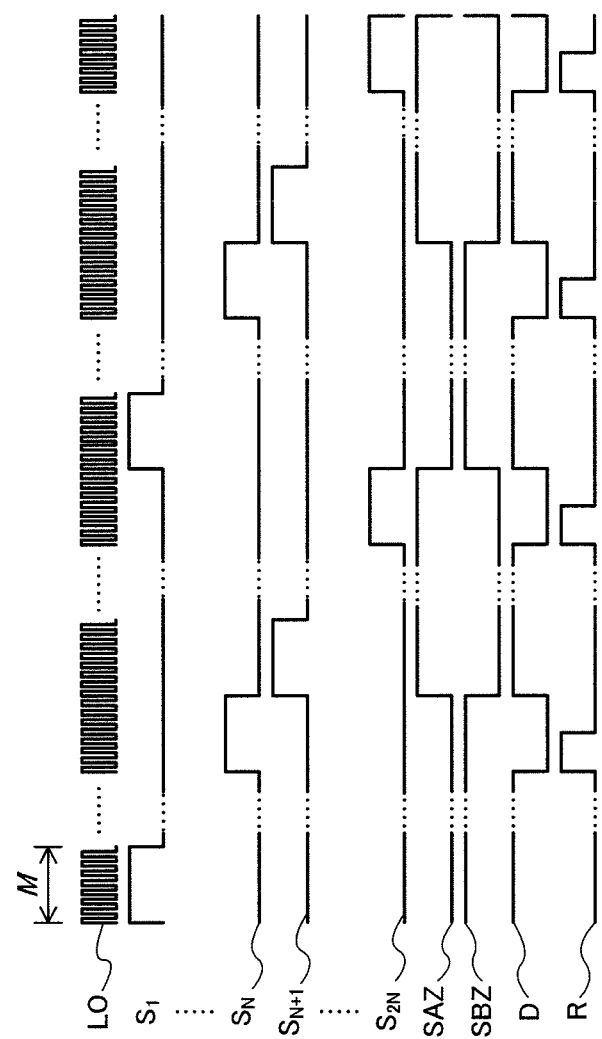
FIG. 6 is a timing chart provided to explain control signals of Embodiment 1.

FIG. 6 is a timing chart of control signals output from digital control unit 105 and a local frequency signal supplied to sampling switch 1012. Control signals $S_1$ through $S_{2N}$ are signals whose high periods are displaced relative to each other, with the time for which each is high corresponding to M cycles of local frequency signal LO.

Control signal $S_1$ is sent to integration switch $1015_1$ of discrete time analog processing circuits 101-1 through 101-n, and similarly, control signal $S_N$ is sent to integration switch $1015_N$, control signal $S_{N+1}$ is sent to integration switch $1015_{N+1}$, and control signal $S_{2N}$ is sent to integration switch $1015_{2N}$.

Control signal SAZ and control signal SBZ are control signals that go high alternately, and set a rotation capacitor connection state by means of discharge switch group $1016_1$ through $1016_{2N}$ to which they are sent. Control signal SAZ is sent to discharge switches $1016_1$ through $1016_{2N}$ of discrete time analog processing circuits 101-1 through 101-n. Control signal SBZ is sent to discharge switches $1016_1$ through $1016_{2N}$. Control signal D and control signal R are sent to damping switch 103 and reset switch 104 respectively.

The kind of circuit configuration used subsequent to buffer capacitor 102 is not particularly limited by the present invention. For example, a configuration may be used whereby a discrete signal value undergoes a sample and hold operation directly according to the charge amount accumulated in buffer capacitor 102 and is then quantized as a digital value, after which discrete time digital signal processing is performed. As another example, a configuration may be used whereby a discrete signal value is converted to a voltage again according to the charge amount accumulated in buffer capacitor 102, after which signal processing is further performed.

Next, the operation of discrete time direct sampling receiver 10 and discrete time direct sampling circuit 100 will be described.

Electromagnetic wave 21 transmitted from a transmitting station (not shown) at carrier frequency $f_{RF}$ is converted from an electromagnetic wave to analog RF signal 22 by antenna 11, and is amplified by low noise amplifier 12. Amplified analog RF signal 23 undergoes discrete time sampling using local frequency signal 24 in discrete time direct sampling circuit 13, and is frequency-converted to a baseband frequency band. Also, a desired signal component is extracted by means of discrete temporal filter processing by discrete time direct sampling circuit 13, and baseband signal 25 is obtained thereby. Baseband signal 25 is quantized as a digital value by analog/digital conversion processing section 15, predetermined digital reception processing such as demodulation processing and decoding processing is performed by digital reception processing section 16, and receive data 27 is obtained thereby.

Next, the operation of discrete time direct sampling circuit 100 of this embodiment will be described. Discrete time direct sampling circuit 100 converts input analog RF signal 23 to an analog RF current signal by means of voltage-to-current converter 1011 in each of discrete time analog processing circuits 101-1 through 101-n connected in parallel, and performs sampling by means of sampling switch 1012 with local frequency signal 24 having frequency LO that is virtually the same as that of the analog RF current signal. Furthermore, discrete time direct sampling circuit 100 forms discrete signals that are temporally discretized by integrating the sampling signal charges by means of damping switch 103 and rotation capacitor group $1014_1$ through $1014_{2N}$ in discrete time analog processing circuits 101-1 through 101-n. Discrete time direct sampling circuit 100 also performs operations equivalent to the characteristics of a first FIR filter and second FIR filter by performing on/off control of integration switch group $1015_1$ through $1015_{2N}$ and discharge switch group $1016_1$ through $1016_{2N}$ between damping switch 103 and rotation capacitor group $1014_1$ through $1014_{2N}$ in discrete time analog processing circuits 101-1 through 101-n. The operation of each of discrete time analog processing circuits 101-1 through 101-n is as previously described using FIG. 1.

Here, a first FIR filter characteristic is determined by the length of time for which each of control signals $S_1$ through $S_{2N}$ is high—that is, the length of time for which integration is performed by charging in history capacitor 1013 and rotation capacitor group $1014_1$ through $1014_{2N}$—in each of the provided plurality of discrete time direct sampling circuit systems 101-1 through 101-n. In this embodiment, the length of time for which integration is performed is M cycles of local frequency LO, and therefore the transfer function of a first FIR filter characteristic realized in each system can be expressed by Equation (1).

[1]

$$H_{FIR1\_k} = \frac{1 - z^{-M}}{1 - z^{-1}} \quad \text{(Equation 1)}$$

Also, a second FIR filter characteristic is determined by the number of capacitors, N, selected by control signal SAZ or SBZ from rotation capacitor group $1014_1$ through $1014_{2N}$, and the value of aforementioned M, regardless of a circuit element value used in each of the provided plurality of discrete time direct sampling circuit systems 101-1 through 101-n, and the transfer function of a second FIR filter characteristic realized in each system can be expressed by Equation (2).

[2]

$$H_{FIR2\_k} = \frac{1 - z^{-M \times N}}{1 - z^{-M}} \quad \text{(Equation 2)}$$

Also, charge sharing is performed between capacitors connected by means of control signals $S_1$ through $S_{2N}$ supplied to integration switch group $1015_1$ through $1015_{2N}$ between history capacitor 1013 and rotation capacitor group $1014_1$ through $1014_{2N}$ in each of the provided plurality of discrete time analog processing circuits 101-1 through 101-$n$, and a third IIR filter characteristic is realized by the results of charge sharing in each system being combined by later-stage output section 110, the transfer function of which can be expressed by Equation (3). In Equation (3), a gain term when a current signal is integrated in a discrete time analog processing circuit and converted to a discrete charge amount is also included in the expression.

[3]

$$H_{IIR3} = \left(\frac{T_S}{\pi}\sum_{k=1}^{n}\frac{gm_k C_{Rk}/C_{Hk}}{1+C_{Rk}/C_{Hk}-z^{-M}}\right)\bigg/\sum_{k=1}^{n}C_{Rk} \quad \text{(Equation 3)}$$

Here, in Equation (3), $T_S$ is the sampling interval when sampling is performed in sampling switch 1012 by means of local signal frequency LO, $gm_k$ is the transconductance value of voltage-to-current converter 1011 in the k-th discrete time analog processing circuit 101 system, $C_{Hk}$ is the capacitance value of history capacitor 1013 in the k-th discrete time analog processing circuit 101 system, and $C_{Rk}$ is the capacitance value per rotation capacitor 1014 in the k-th discrete time analog processing circuit 101 system.

Also, charge sharing is performed between capacitors connected by means of control signals SAZ and SBZ supplied to discharge switch group $1016_1$ through $1016_{2N}$ between rotation capacitor group $1014_1$ through $1014_{2N}$ and buffer capacitor 102 in each of the provided plurality of discrete time analog processing circuits 101-1 through 101-$n$, and a fourth IIR filter characteristic is newly realized, the transfer function of which can be expressed by Equation (4).

[4]

$$H_{IIR4} = \frac{\sum_{k=1}^{n} C_{Rk}/C_B}{1-z^{-M\times N}+\sum_{k=1}^{n} NC_{Rk}/C_B} \quad \text{(Equation 4)}$$

Here, in Equation (4), $C_B$ is the capacitance value of buffer capacitor 102.

From the above, filter processing total transfer characteristic H(z) obtained by overall discrete time direct sampling circuit 100 shown in FIG. 5 is expressed as a characteristic combining the characteristics from Equation (1) to Equation (4), and substitution can be performed as in Equation (5).

[5]

$$H(z) = \frac{1-z^{-M}}{1-z^{-1}}\frac{1-z^{-M\times N}}{1-z^{-M}} \quad \text{(Equation 5)}$$

$$\left(\frac{T_S}{\pi}\sum_{k=1}^{n}\frac{gm_k C_{Rk}/C_{Hk}}{1+C_{Rk}/C_{Hk}-z^{-M}}\right)\frac{1}{\sum_{k=1}^{n}C_{Rk}}$$

$$\frac{\sum_{k=1}^{n}C_{Rk}/C_B}{1-z^{-M\times N}+\sum_{k=1}^{n}NC_{Rk}/C_B}$$

-continued $$= \left(\frac{MT_S}{\pi}\sum_{k=1}^{n}\frac{gm_k C_{Rk}/C_{Hk}}{1+C_{Rk}/C_{Hk}-z^{-M}}\right)\frac{1}{\sum_{k=1}^{n}C_{Rk}}\frac{1}{M}$$

$$\frac{1-z^{-M}}{1-z^{-1}}\frac{1}{N}\frac{1-z^{-M\times N}}{1-z^{-M}}$$

$$\frac{\sum_{k=1}^{n}NC_{Rk}/C_B}{1-z^{-M\times N}+\sum_{k=1}^{n}NC_{Rk}/C_B}$$

$$= H'_{IIR3}(z)\times\frac{1}{M}\frac{1-z^{-M}}{1-z^{-1}}\frac{1}{N}\frac{1-z^{-M\times N}}{1-z^{-M}}$$

$$\frac{\sum_{k=1}^{n}NC_{Rk}/C_B}{1-z^{-M\times N}+\sum_{k=1}^{n}NC_{Rk}/C_B}$$

The important point here is that, in the transfer function expressed by Equation (5), a desired filter frequency response characteristic is not obtained even if circuit element values $gm_k$, $C_{Hk}$, $C_{Rk}$, and $C_B$ in n circuit systems are simply set arbitrarily.

That is to say, in the case of the third IIR filter characteristic expressed by Equation (3), in particular, although it is possible to obtain an equivalently high-dimensional characteristic by connecting a plurality of discrete time analog processing circuit 101 systems having a first-order IIR characteristic in parallel, a method of deriving a circuit element value that realizes a filter characteristic capable of handling wideband signal reception, which is the object of the present invention, has not thus far been considered. This derivation method will be described below. The characteristic of a part equivalent to the third IIR filter is expressed in the form of the sum of first-order low-pass filters in the z-region. Meanwhile, the sum of first-order low-pass filters can be expressed by Equation (6) in the s-region.

[6]

$$H''_{IIR3}(s) = \sum_{k=1}^{n}\frac{a_k}{s+\omega_k} \quad \text{(Equation 6)}$$

Here, if Equation (6) is substituted in a z-region equation using a relational expression such as shown in Equation (7) differing from both first-order conversions generally used in s-z conversion, this is expressed by Equation (8).

[7]

$$s = \frac{1-z^{-M}}{MT_S} \quad \text{(Equation 7)}$$

[8]

$$H''_{IIR3}(z) = \sum_{k=1}^{n}\frac{MT_S a_k}{1+MT_S\omega_k - z^{-M}} \quad \text{(Equation 8)}$$

By comparing the term $H'_{IIR3}$ in Equation (5) with $H''_{IIR3}$ in Equation (8), relational expressions such as shown by Equation (9) and Equation (10) hold true for the element values.

[9]

$$C_{Hk} = \frac{C_{Rk}}{MT_S\omega_k}$$ (Equation 9)

[10]

$$gm_k = \frac{\pi a_k}{MT_S\omega_k} \times \left(\sum_{k=1}^{n} C_{Rk}\right)$$ (Equation 10)

Thus, if DC gain, an attenuation pole position, and so forth are set based on Equation (6), and constants $a_k$ and $\omega_k$ are determined and substituted in Equation (9) and Equation (10), and furthermore $C_{Rk}$ is established, optimal values of $C_{Hk}$ and $gm_k$ are found.

As described above, according to the configuration and operation of this embodiment, by connecting a plurality of discrete time analog processing circuits 101-1 through 101-n in parallel, and using a circuit configuration whereby charge signals obtained by respective discrete time direct sampling circuit systems 101-1 through 101-n are combined by buffer capacitor 102, it is possible for an IIR filter realized in a discrete time direct sampling circuit to be made high-dimensional. Furthermore, the types and number of circuit element values that can be set in realizing a filter characteristic increase, making it possible to greatly improve the degree of design freedom of a filter. In particular, by setting the number of discrete time analog processing circuit systems provided in parallel appropriately according to filter performance required by a receiver, it is possible to set the number of attenuation poles and their position on the frequency axis arbitrarily, and to realize a filter characteristic capable of handling wideband signal reception.

Also, according to this embodiment, optimal values of circuit elements of plurality of discrete time analog processing circuits 101-1 through 101-n are determined so as to satisfy the relationships of Equation (9) and Equation (10). That is to say, the capacitance values of history capacitors $C_{H1}$ through $C_{Hn}$ of discrete time analog processing circuits 101-1 through 101-n are set related to the ratio between the capacitance value of rotation capacitors $1014_1$ through $1014_{2N}$ provided in each of discrete time analog processing circuits 101-1 through 101-n and the cutoff frequency set value of each of discrete time analog processing circuits 101-1 through 101-n, and transconductances $gm_1$ through $gm_n$ of voltage-to-current converter 1011 of each of discrete time analog processing circuits 101-1 through 101-n are set related to the ratio between the sum of the capacitance values of rotation capacitor group $1014_1$ through $1014_{2N}$ of all of discrete time analog processing circuits 101-1 through 101-n and the cutoff frequency set value of each of discrete time analog processing circuits 101-1 through 101-n. By this means, when plurality of discrete time analog processing circuits 101-1 through 101-n are connected in parallel, circuit element values for realizing a desired filter frequency response characteristic can be derived comparatively easily.

In this embodiment, it has been assumed in the description that capacitance values $C_{RK}$ of rotation capacitor group $1014_1$ through $1014_{2N}$ in each of the n provided discrete time direct sampling circuit systems 101-1 through 101-n are made mutually different values, but the present invention is not necessarily limited to this case, and the capacitance value of $C_R$ may be made the same among the systems.

Also, in the description of the configuration shown in this embodiment, a case has been assumed in which local frequency signal LO supplied to sampling switch 1012 is generated and supplied separately from digital control unit 105, but the present invention is not limited to this case, and a configuration may also be used whereby local frequency signal LO is also generated and supplied to sampling switch 1012 by digital control unit 105.

Embodiment 2

In this embodiment, an example is described of a configuration and realized filter characteristic when the number of parallel systems in the parallel configuration of discrete time analog processing circuits shown in Embodiment 1 is two. In this embodiment, also, appropriate configuration conditions for this case are presented.

Figure 7:
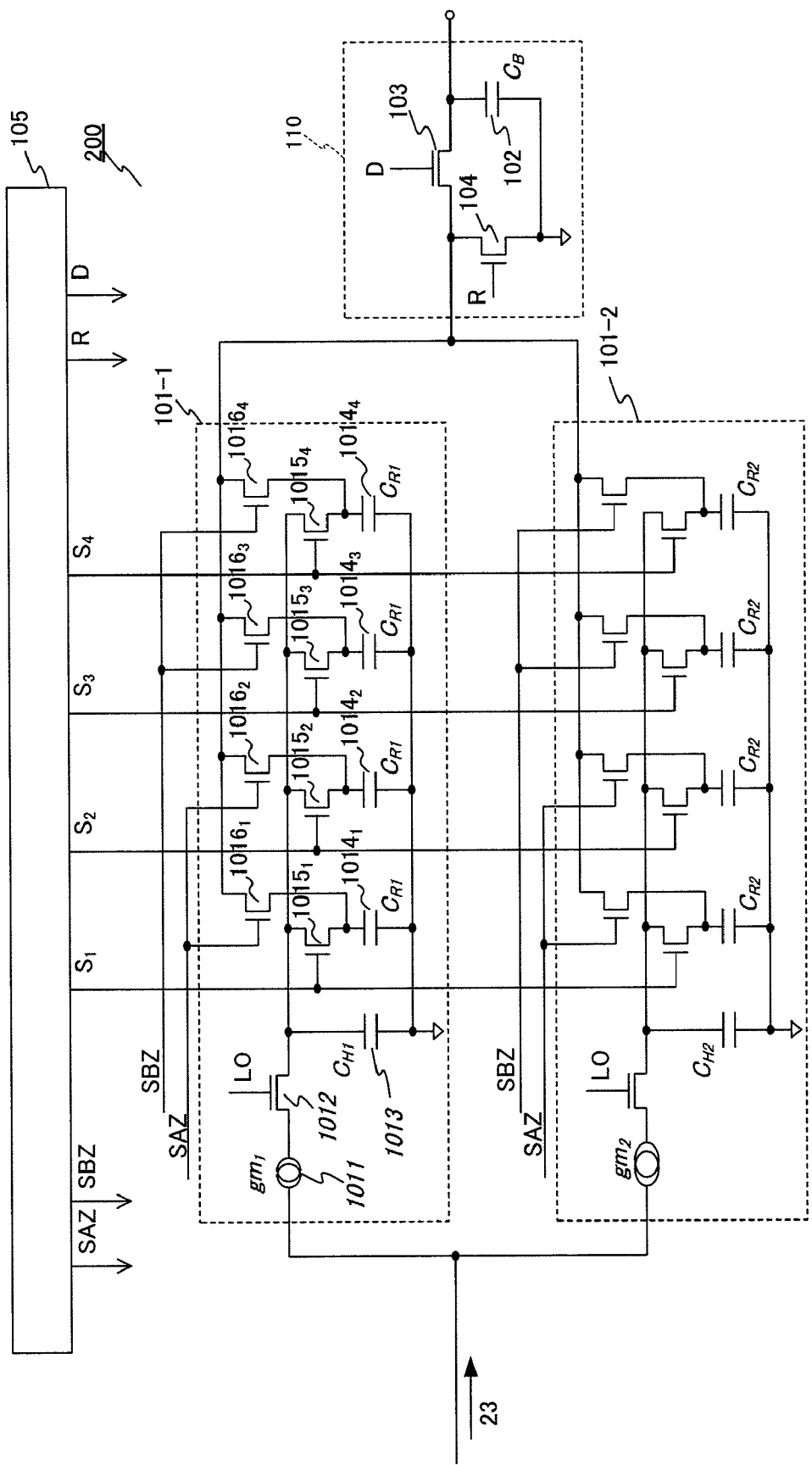
FIG. 7 is a connection diagram showing the configuration of a discrete time direct sampling circuit of Embodiment 2.

FIG. 7 shows the configuration of a discrete time direct sampling circuit of this embodiment. In direct sampling circuit 200, the number of discrete time analog processing circuit 101 systems connected in parallel in direct sampling circuit 100 shown in FIG. 4 has been made two. A case is shown here in which, as an example, the number (2N) of rotation capacitors 1014 in each of discrete time analog processing circuits 101-1 and 101-2 is four (that is, N=2). Items in FIG. 7 having the same configuration and operation as in FIG. 4 are assigned the same reference numbers as in FIG. 4, and descriptions thereof are omitted.

Figure 8:
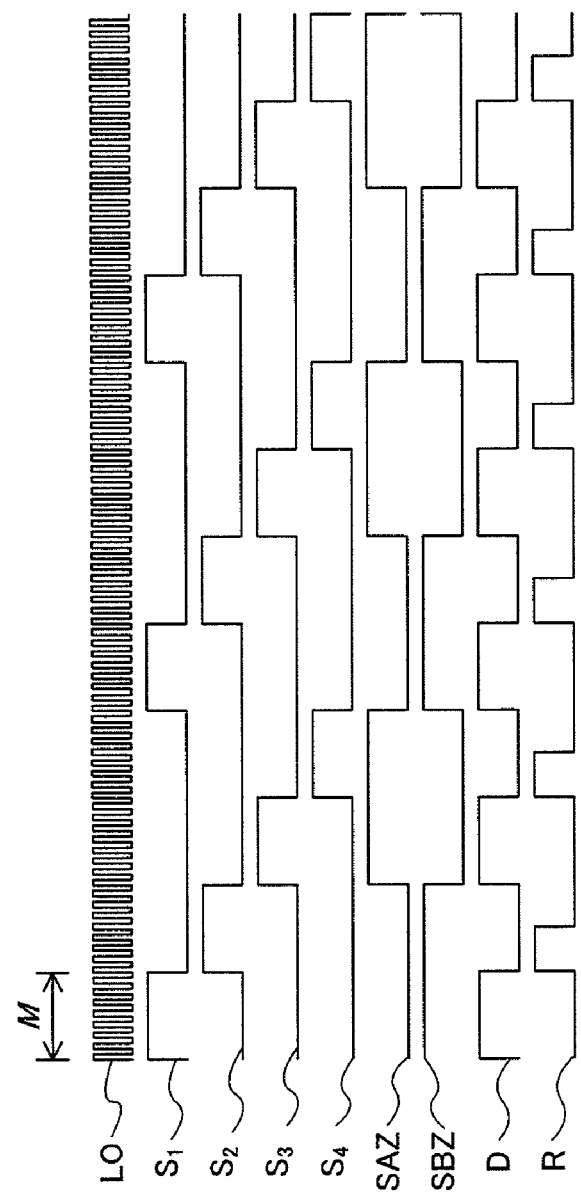
FIG. 8 is a timing chart provided to explain control signals of Embodiment 2.

FIG. 8 is a timing chart of control signals output from digital control unit 105 and a local frequency signal supplied to sampling switch 1012 in this embodiment. Control signals $S_1$ through $S_4$ are signals whose high periods are displaced relative to each other, with the time for which each is high corresponding to M cycles of local frequency signal LO. In this embodiment, a setting of M=8 is used as an example.

Control signal $S_1$ is sent to integration switch $1015_1$ of discrete time analog processing circuits 101-1 and 101-2, and similarly, control signal $S_2$ is sent to integration switch $1015_2$, control signal $S_3$ is sent to integration switch $1015_3$, and control signal $S_4$ is sent to integration switch $1015_4$.

Control signal SAZ and control signal SBZ are control signals that go high alternately, and set a connection state for the two rotation capacitors by means of discharge switches $1016_1$ through $1016_4$ to which they are sent. Control signal SAZ is sent to discharge switches $1016_1$ and $1016_2$ of discrete time analog processing circuits 101-1 and 101-2. Control signal SBZ is sent to discharge switches $1016_3$ and $1016_4$. Control signal D and control signal R are sent to damping switch 103 and reset switch 104 respectively.

A filter characteristic realized by overall discrete time direct sampling circuit 200 configuration as described above is expressed by Equation (11) through Equation (13).

[11]

$$H(z) = H'_{IIR3}(z)\frac{1}{8}\frac{1-z^{-8}}{1-z^{-1}}\frac{1}{2}\frac{1-z^{-16}}{1-z^{-8}}\frac{b_1+b_2}{b_1+b_2+1-z^{-16}}$$ (Equation 11)

[12]

$$H'_{IIR3}(z) = \frac{8gm_1T_S}{\pi(C_{R1}+C_{R2})}\frac{C_{R1}/C_{H1}}{1-z^{-8}+C_{R1}/C_{H1}}+$$ (Equation 12)

-continued $$\frac{8gm_2 T_S}{\pi(C_{R1}+C_{R2})} \frac{C_{R2}/C_{H2}}{1-z^{-8}+C_{R2}/C_{H2}}$$

where,

[13]

$$b_1 = \frac{2C_{R1}}{C_B}, \quad b_2 = \frac{2C_{R2}}{C_B} \qquad \text{(Equation 13)}$$

Here, in the part composing a third IIR filter characteristic expressed by Equation (12), since two first-order low-pass filters are connected in parallel, the transfer function can be expressed by means of angular frequency ω as shown in Equation (14) and Equation (15).

[14]

$$H''_{IIR3}(\omega) = \frac{a_1}{\omega_1 + j\omega} + \frac{a_2}{\omega_2 + j\omega} \qquad \text{(Equation 14)}$$

$$= \frac{A_1 + j\omega A_2}{(\omega_1 + j\omega)(\omega_2 + j\omega)}$$

where,

[15]

$$A_1 = a_1\omega_2 + a_2\omega_1, \quad A_2 = a_1 + a_2 \qquad \text{(Equation 15)}$$

As an example, assuming the conditions shown in Equation (16), if the values of the circuit elements in discrete time direct sampling circuit 200 are derived from Equation (9), Equation (10), Equation (14), and Equation (15), the values shown in Equation (17) are obtained.

[16]

$$\begin{cases} f_1 = \omega_1/2\pi = 2.1 \text{ MHz} \\ f_2 = \omega_2/2\pi = 2.7 \text{ MHz} \\ a_1 = -1.894 \times 10^7 \\ a_2 = 4.128 \times 10^7 \\ f_s = 1/T_s = 2400 \text{ MHz} \\ M = 8 \\ C_{R1} = C_{R2} = 1 \text{ pF} \end{cases} \qquad \text{(Equation 16)}$$

[17]

$$\begin{cases} gm_1 = -2.706 \text{ mS} \\ gm_2 = 4.587 \text{ mS} \\ C_{H1} = 22.74 \text{ pF} \\ C_{H2} = 17.68 \text{ pF} \end{cases} \qquad \text{(Equation 17)}$$

Figure 9:
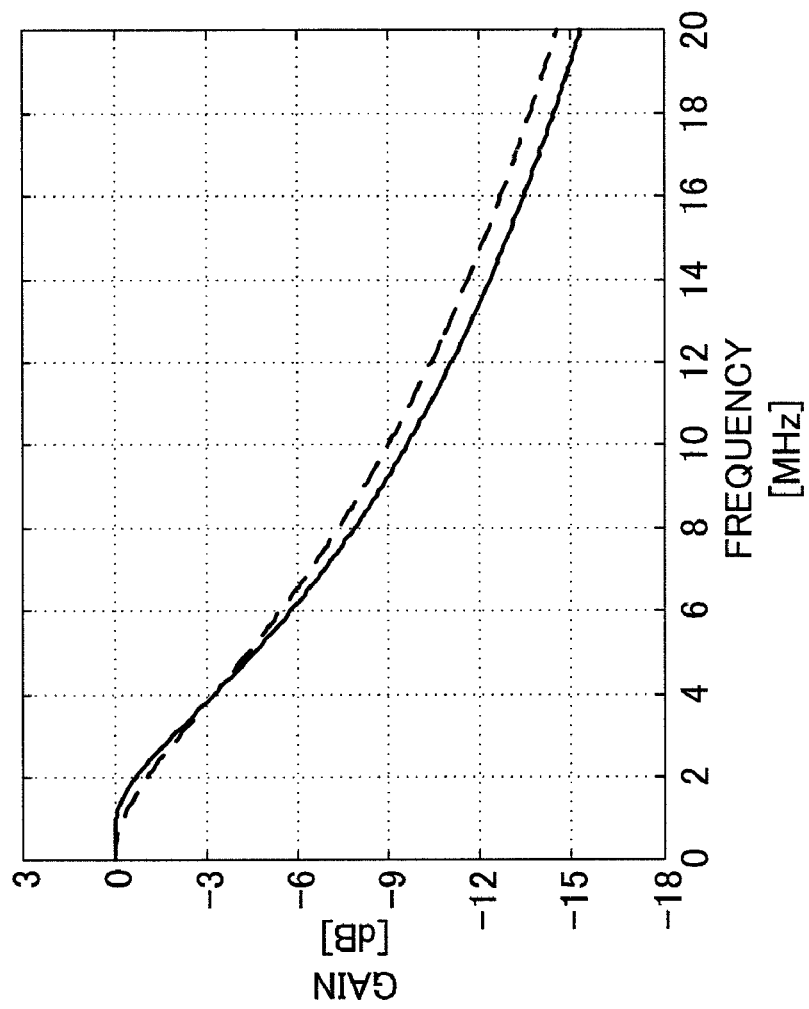
FIG. 9 is a characteristic graph showing an example of a third IIR filter characteristic realized by Embodiment 2.

FIG. 9 is a graph showing a frequency response characteristic of a third IIR filter obtained when the conditions shown in Equation (16) and the circuit element values shown in Equation (17) are used in dual-parallelism discrete time direct sampling circuit 200 shown in FIG. 7, this characteristic being indicated by the solid line. On the other hand, as an example for comparison, the dotted line in FIG. 9 is a frequency response characteristic when a configuration with only a single discrete time analog processing circuit system is employed, the configuration being such that the bandwidth for which 3 dB attenuation is obtained is the same. From FIG. 9, it can be confirmed that, by using a configuration with two systems in parallel in discrete time direct sampling circuit 200 of this embodiment, as compared with a configuration employing only a single discrete time analog processing circuit system in the conventional manner, gain fluctuation in a passing frequency region is reduced, and it is possible to achieve a greater amount of attenuation in a cutoff frequency region.

Next, an example will be described of a case in which a band-pass filter characteristic is realized by providing an attenuation pole at 0 Hz in a configuration equipped with two discrete time analog processing circuit systems. In the characteristic expressed by Equation (14), when the condition in Equation (18) is satisfied, ω=0 and the transfer function becomes 0.

[18]

$$a_2 = -\frac{\omega_2}{\omega_1} a_1 \qquad \text{(Equation 18)}$$

Therefore, if the conditions shown in Equation (19) are assumed as conditions that satisfy Equation (18), and the values of the circuit elements in discrete time direct sampling circuit 200 are derived from Equation (9), Equation (10), Equation (14), and Equation (15), the values shown in Equation (20) are obtained.

[19]

$$\begin{cases} f_1 = \omega_1/2\pi = 2.0 \text{ MHz} \\ f_2 = \omega_2/2\pi = 4.0 \text{ MHz} \\ a_1 = -3.870 \times 10^7 \\ a_2 = -\frac{\omega_2}{\omega_1} a_1 = 7.740 \times 10^7 \\ f_s = 1/T_s = 2400 \text{ MHz} \\ M = 8 \\ C_{R1} = C_{R2} = 1 \text{ pF} \end{cases} \qquad \text{(Equation 19)}$$

[20]

$$\begin{cases} gm_1 = -5.805 \text{ mS} \\ gm_2 = 5.805 \text{ mS} \\ C_{H1} = 23.87 \text{ pF} \\ C_{H2} = 11.94 \text{ pF} \end{cases} \qquad \text{(Equation 20)}$$

Figure 10:
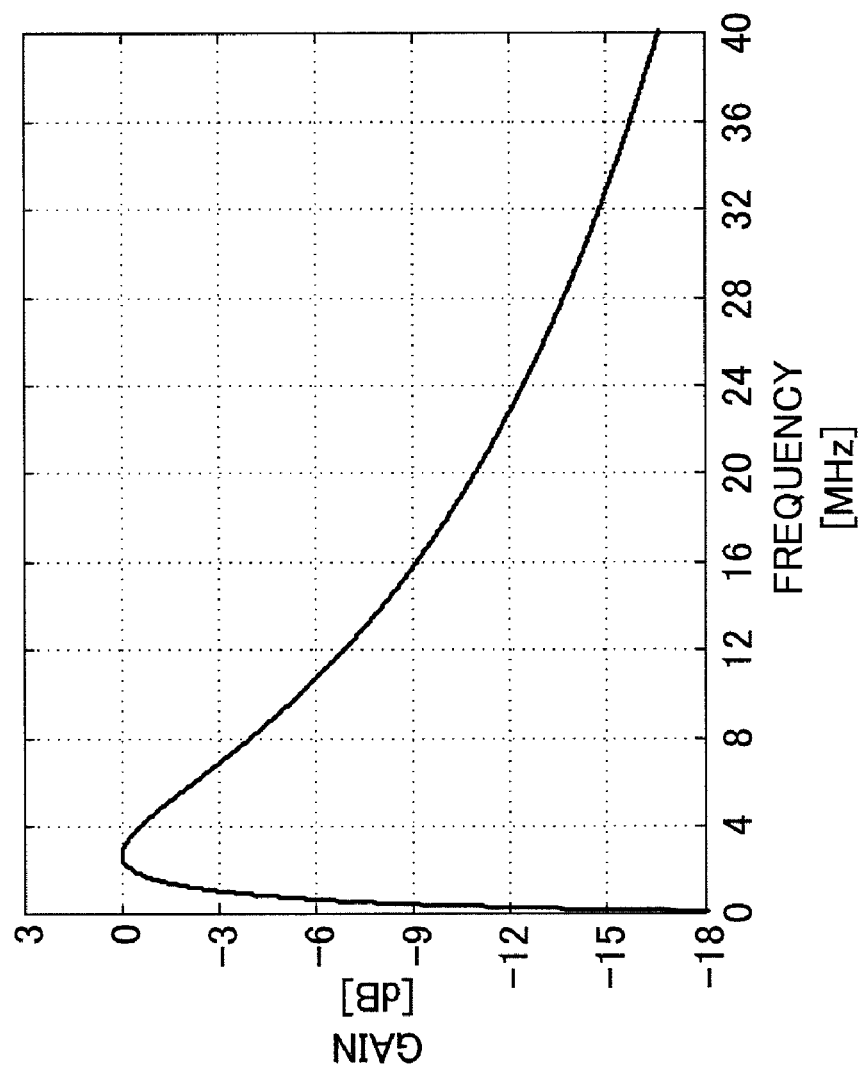
FIG. 10 is a characteristic graph showing another example of a third IIR filter characteristic realized by Embodiment 2.

FIG. 10 is a graph showing a frequency response characteristic of a third IIR filter obtained when the circuit element values expressed in Equation (20), derived according to the conditions shown in Equation (18) and Equation (19), are used in dual-parallelism discrete time direct sampling circuit 200 shown in FIG. 7.

As described above, according to the configuration and operation of this embodiment, by connecting two discrete time analog processing circuit systems in parallel, and using a circuit configuration whereby charge signals obtained by each system are combined by buffer capacitor 102, it is possible for a characteristic of an IIR filter realized in a discrete time direct sampling circuit to be made equivalently high-dimensional, and it is possible to realize a frequency response characteristic and band-pass characteristic that obtain a steeper frequency-attenuation characteristic.

Embodiment 3

In this embodiment, an example of realization of a desired filter characteristic when triple-parallelism is used is described as an example of a case in which the number of parallel systems in the parallel configuration of discrete time analog processing circuits shown in Embodiment 1 is an odd number of three or more. In this embodiment, also, appropriate configuration conditions for this case are presented.

The overall configuration of a discrete time direct sampling circuit according to this embodiment is based on the generalized circuit configuration and control signals shown using FIG. 4 and FIG. 5 in Embodiment 1, and can be realized by those skilled in the art using the same kind of concept as illustrated in concrete terms as a dual-parallelism configuration example in Embodiment 2, and therefore illustrations and descriptions of the configuration elements are omitted.

Of the filter characteristics realized by a discrete time direct sampling circuit in which three discrete time analog processing circuit systems are connected in parallel, the frequency response characteristic of a corresponding part of a third IIR filter is expressed by an angular frequency ω function as shown in Equation (21).

[21]

$$H''_{IIR3}(\omega) = \frac{a_1}{\omega_1 + j\omega} + \frac{a_2}{\omega_2 + j\omega} + \frac{a_3}{\omega_3 + j\omega} = \frac{(a_1 + a_2 + a_3)\omega^2 - \begin{pmatrix} a_1\omega_2\omega_3 + a_2\omega_3\omega_1 + \\ a_3\omega_1\omega_2 \end{pmatrix} + j\omega\begin{Bmatrix} a_1(\omega_2 + \omega_3) + \\ a_2(\omega_3 + \omega_1) + a_3(\omega_1 + \omega_2) \end{Bmatrix}}{\omega_1\omega_2\omega_3 - (\omega_1 + \omega_2 + \omega_3)\omega^2 + j\omega\begin{pmatrix} \omega_1\omega_2 + \omega_2\omega_3 + \\ \omega_3\omega_1 - \omega^2 \end{pmatrix}}$$ (Equation 21)

In Equation (21), the filter characteristic has an attenuation pole when the conditions in Equation (22) and Equation (23) are satisfied.

[22]

$$a_1(\omega_2+\omega_3)+a_2(\omega_3+\omega_1)+a_3(\omega_1+\omega_2)=0$$ (Equation 22)

[23]

$$(a_1\omega_2\omega_3+a_2\omega_3\omega_1+a_3\omega_1\omega_2)/(a_1+a_2+a_3)>0$$ (Equation 23)

From the condition in Equation (23), Equation (24) is obtained.

[24]

$$a_3 = -\frac{\omega_2 + \omega_3}{\omega_1 + \omega_2}a_1 - \frac{\omega_3 + \omega_1}{\omega_1 + \omega_2}a_2$$ (Equation 24)

If both the numerator and the denominator are negative in the condition in Equation (23), the condition in Equation (25) is obtained.

[25]

$$a_1 < \frac{\omega_3 - \omega_2}{\omega_1 - \omega_3}a_2 \text{ and } a_1 > \frac{\omega_1^2\omega_2 - \omega_3}{\omega_2^2\omega_3 - \omega_1}a_2$$ (Equation 25)

On the other hand, if both the numerator and the denominator are positive, the condition in Equation (26) is obtained.

[26]

$$a_1 > \frac{\omega_3 - \omega_2}{\omega_1 - \omega_3}a_2 \text{ and } a_1 < \frac{\omega_1^2\omega_2 - \omega_3}{\omega_2^2\omega_3 - \omega_1}a_2$$ (Equation 26)

Figure 11:
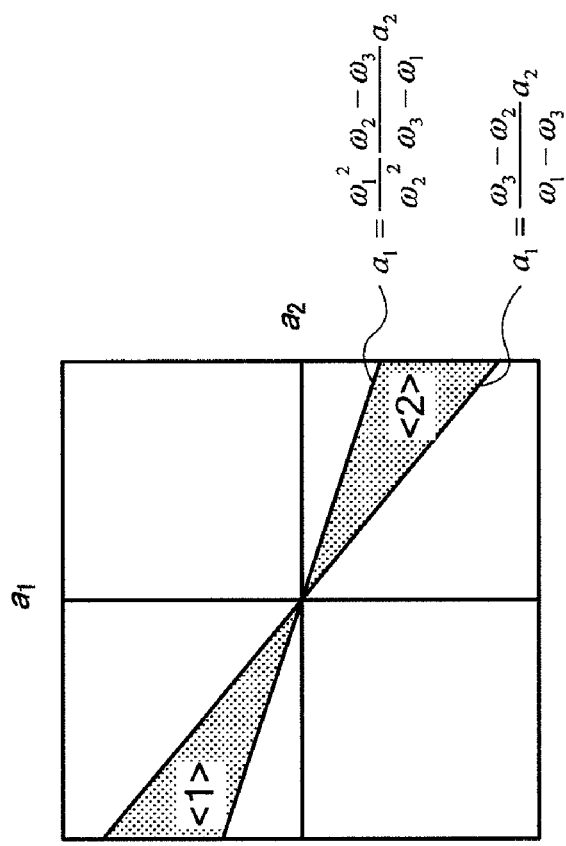
FIG. 11 is a drawing showing conditions that a1 and a2 values should satisfy in order for a third IIR filter characteristic to have an attenuation pole in Embodiment 3.

Furthermore, if the condition $\omega_1 < \omega_2 < \omega_3$ is added, a1 and a2 that satisfy these conditions are equivalent to the shaded parts in FIG. 11. The second quadrant <1> area in FIG. 11 corresponds to Equation (25), and the fourth quadrant <2> area corresponds to Equation (26).

Here, if the attenuation pole position is designated $\omega_{Null}$, this is expressed by Equation (27).

[27]

$$\omega_{Null} = \sqrt{\frac{a_1\omega_2\omega_3 + a_2\omega_3\omega_1 + a_3\omega_1\omega_2}{a_1 + a_2 + a_3}}$$ (Equation 27)

Here, if DC gain in the third IIR filter is designated D, D is expressed by Equation (28).

[28]

$$D = \frac{a_1}{\omega_1} + \frac{a_2}{\omega_2} + \frac{a_3}{\omega_3}$$ (Equation 28)

Furthermore, if, as an example, settings are made as shown in Equation (29), functions $a_1$ through $a_3$ can be derived as shown in Equation (30).

[29]

$$\omega_2 = 2\omega_1, \omega_3 = 3\omega_1$$ (Equation 29)

[30]

$$a_1 = \frac{3D\omega_1(\omega_N^2 + \omega_1^2)}{\omega_N^2},$$

$$a_2 = \frac{6D\omega_1(\omega_N^2 + 4\omega_1^2)}{\omega_N^2},$$

$$a_3 = \frac{3D\omega_1(\omega_N^2 + 9\omega_1^2)}{\omega_N^2}$$ (Equation 30)

If, as an example, the values of the configuration elements in a discrete time direct sampling circuit with a triple-parallelism configuration are derived assuming the conditions shown in Equation (31), circuit element values such as shown in Equation (32) are obtained.

[31]

$$\begin{cases} f_1 = \omega_1/2\pi = 2.0 \text{ MHz} \\ f_2 = \omega_2/2\pi = 2\omega_1/2\pi = 4.0 \text{ MHz} \\ f_3 = \omega_2/2\pi = 3\omega_1/2\pi = 6.0 \text{ MHz} \\ f_{Null} = \frac{\omega}{2^{Null}_\pi} = 10 \text{ MHz} \\ a_1 = 3.921 \times 10^7 \\ a_2 = -8.746 \times 10^7 \\ a_3 = 5.127 \times 10^7 \\ f_s = 1/T_s = 2400 \text{ MHz} \\ M = 8 \\ C_{R1} = C_{R2} = C_{R3} = 1 \text{ pF} \end{cases}$$ (Equation 31)

[32]

$$\begin{cases} gm_1 = 8.822 \text{ mS} \\ gm_2 = -9.839 \text{ mS} \\ gm_3 = 3.845 \text{ mS} \\ C_{H1} = 23.87 \text{ pF} \\ C_{H2} = 11.94 \text{ pF} \\ C_{H3} = 7.958 \text{ pF} \end{cases}$$ (Equation 32)

Figure 12:
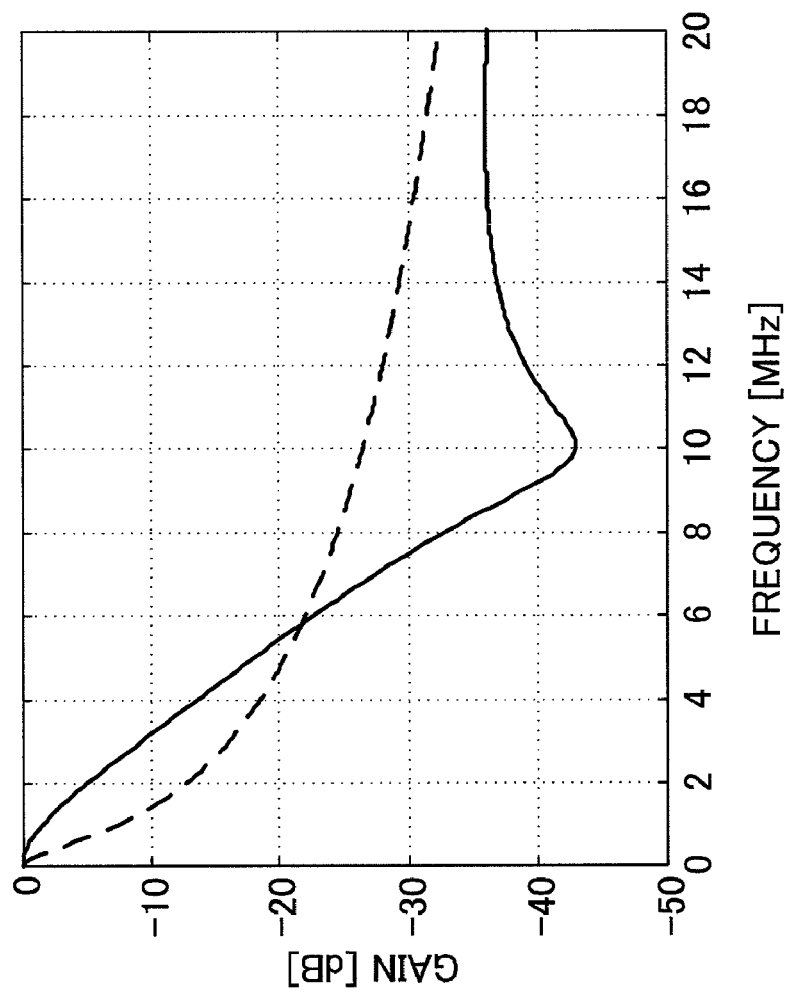
FIG. 12 is a characteristic graph showing an example of a third IIR filter characteristic realized by Embodiment 3.

FIG. 12 is a graph showing a third IIR filter characteristic realized by means of the conditions shown in Equation (31), this characteristic being indicated by the solid line. On the other hand, as an example for comparison, the dotted line in FIG. 12 is a frequency response characteristic when a configuration with only a single discrete time analog processing circuit system is employed, the configuration being such that the DC gain and high-frequency-region attenuation amount are equal. From FIG. 12, it can be confirmed that, by using a configuration with three systems in parallel, as compared with a configuration employing only a single discrete time analog processing circuit system in the conventional manner, gain fluctuation in a passing frequency region is reduced, there is an attenuation pole at the 10 MHz frequency position, and it is possible to achieve a greater amount of attenuation in the surrounding frequency regions.

As described above, according to the configuration and operation of this embodiment, by connecting three discrete time analog processing circuit systems in parallel, and using a circuit configuration whereby charge signals obtained by each system are combined by buffer capacitor 102, it is possible for a characteristic of an IIR filter realized in a discrete time direct sampling circuit to be made equivalently high-dimensional.

In addition, by setting element values so as to satisfy the kind of conditions described above, in particular, it is possible to realize a characteristic having one attenuation pole on the frequency axis.

Embodiment 4

In this embodiment, an example of realization of a desired filter characteristic when quintuple-parallelism is used is described as an example of a case in which the number of parallel systems in the parallel configuration of discrete time analog processing circuits shown in Embodiment 1 is an odd number of three or more. In this embodiment, also, appropriate configuration conditions for this case are presented.

The overall configuration of a discrete time direct sampling circuit according to this embodiment is based on the generalized circuit configuration and control signals shown using FIG. 4 and FIG. 5 in Embodiment 1, and can be realized by those skilled in the art using the same kind of concept as illustrated in concrete terms as a triple-parallelism configuration example in Embodiment 3, and therefore illustrations and descriptions of the configuration elements are omitted.

Of the filter characteristics realized by a discrete time direct sampling circuit in which five discrete time analog processing circuit systems are connected in parallel, the frequency response characteristic of a corresponding part of a third IIR filter is expressed by an angular frequency ω function as shown in Equation (33)

[33]

$$H''_{IIR3}(\omega) = \sum_{k=1}^{5} \frac{a_k}{\omega_k + j\omega} = \frac{N_1\omega^4 + N_2\omega^2 + N_3 + j(N_4\omega^3 + N_5\omega)}{D_1\omega^4 + D_2\omega^2 + D_3 + j(\omega^5 + D_4\omega^3 + D_5\omega)}$$ (Equation 33)

Here, in Equation (33), N1 through N5 and D1 through D5 are introduced to make the expression clearer, the expression actually being as shown in Equation (34).

[34]

$$N_1 = a_1 + a_2 + a_3 + a_4 + a_5$$ (Equation 34)

$$N_2 = -\begin{bmatrix} a_1\left\{\begin{matrix}\omega_2\omega_3 + \omega_4\omega_5 + \\ (\omega_2+\omega_3)(\omega_4+\omega_5)\end{matrix}\right\} + \\ a_2\left\{\begin{matrix}\omega_1\omega_3 + \omega_4\omega_5 + \\ (\omega_1+\omega_3)(\omega_4+\omega_5)\end{matrix}\right\} + \\ a_3\left\{\begin{matrix}\omega_1\omega_2 + \omega_4\omega_5 + \\ (\omega_1+\omega_2)(\omega_4+\omega_5)\end{matrix}\right\} + \\ a_4\left\{\begin{matrix}\omega_1\omega_2 + \omega_3\omega_5 + \\ (\omega_1+\omega_2)(\omega_3+\omega_5)\end{matrix}\right\} + \\ a_5\left\{\begin{matrix}\omega_1\omega_2 + \omega_3\omega_4 + \\ (\omega_1+\omega_2)(\omega_3+\omega_4)\end{matrix}\right\} \end{bmatrix}$$

$$N_3 = a_1\omega_2\omega_3\omega_4\omega_5 + a_2\omega_1\omega_3\omega_4\omega_5 + a_3\omega_1\omega_2\omega_4\omega_5 + a_4\omega_1\omega_2\omega_3\omega_5 + a_5\omega_1\omega_2\omega_3\omega_4$$

$$N_4 = a_1(\omega_2 + \omega_3 + \omega_4 + \omega_5) + a_2(\omega_1 + \omega_3 + \omega_4 + \omega_5) + a_3(\omega_1 + \omega_2 + \omega_4 + \omega_5) + a_4(\omega_1 + \omega_2 + \omega_3 + \omega_5) + a_5(\omega_1 + \omega_2 + \omega_3 + \omega_4)$$

$$N_5 = -\begin{bmatrix} a_1\left\{\begin{matrix}(\omega_2+\omega_3)\omega_4\omega_5 + \\ \omega_2\omega_3(\omega_4+\omega_5)\end{matrix}\right\} + \\ a_2\left\{\begin{matrix}(\omega_1+\omega_3)\omega_4\omega_5 + \\ \omega_1\omega_3(\omega_4+\omega_5)\end{matrix}\right\} + \\ a_3\left\{\begin{matrix}(\omega_1+\omega_2)\omega_4\omega_5 + \\ \omega_1\omega_2(\omega_4+\omega_5)\end{matrix}\right\} + \\ a_4\left\{\begin{matrix}(\omega_1+\omega_2)\omega_3\omega_5 + \\ \omega_1\omega_2(\omega_3+\omega_5)\end{matrix}\right\} + \\ a_5\left\{\begin{matrix}(\omega_1+\omega_2)\omega_3\omega_4 + \\ \omega_1\omega_2(\omega_3+\omega_4)\end{matrix}\right\} \end{bmatrix}$$

-continued $$D_1 = \omega_1 + \omega_2 + \omega_3 + \omega_4 + \omega_5$$

$$D_2 = -\omega_1\omega_2\omega_3 - \omega_1\omega_2\omega_4 - \omega_1\omega_3\omega_4 - \omega_2\omega_3\omega_4 -$$
$$\omega_1\omega_2\omega_5 - \omega_1\omega_3\omega_5 - \omega_2\omega_3\omega_5 -$$
$$\omega_1\omega_4\omega_5 - \omega_2\omega_4\omega_5 - \omega_3\omega_4\omega_5$$

$$D_3 = \omega_1\omega_2\omega_3\omega_4\omega_5$$

$$D_4 = -\omega_1\omega_2 - \omega_1\omega_3 - \omega_2\omega_3 - \omega_1\omega_4 - \omega_2\omega_4 -$$
$$\omega_3\omega_4 - \omega_1\omega_5 - \omega_2\omega_5 - \omega_3\omega_5 - \omega_4\omega_5$$

$$D_5 = \omega_1\omega_2\omega_3\omega_4 + \omega_1\omega_2\omega_3\omega_5 + \omega_1\omega_2\omega_4\omega_5 +$$
$$\omega_1\omega_3\omega_4\omega_5 + \omega_2\omega_3\omega_4\omega_5$$

When the conditions in Equation (35) and Equation (36) below are both satisfied in Equation (33), the filter characteristic has two attenuation poles. That is to say, first, provision is made for the condition in Equation (35) to be satisfied in order to make the imaginary part of the numerator 0 in Equation (33).

[35]

$$N_4 = N_5 = 0 \qquad \text{(Equation 35)}$$

Also, if the angular frequency positions of the attenuation poles are $\omega_{Null1}$ and $\omega_{Null2}$, provision is made for the condition in Equation (36) to be satisfied in order to make the real part of the numerator 0.

[36]

$$\omega_{Null1}^4 N_1 + \omega_{Null1}^2 N_2 + N_3 = 0, \; (\omega_{Null1}^2 + \omega_{Null2}^2) N_1 + N_2 = 0 \qquad \text{(Equation 36)}$$

Here, if DC gain in the third IIR filter is designated D, Equation (37) can be obtained from Equation (33).

[37]

$$\frac{N_3}{D_3} = D \qquad \text{(Equation 37)}$$

Furthermore, if, as an example, settings are made as shown in Equation (38), functions $a_1$ through $a_5$ can be derived as shown in Equation (39).

[38]

$$\omega_2 = 2\omega_1, \; \omega_3 = 3\omega_1, \; \omega_4 = 4\omega_1, \; \omega_5 = 5\omega_1 \qquad \text{(Equation 38)}$$

[39]

$$a_1 = \frac{5D\omega_1\left(\begin{array}{c}\omega_{Null1}^2\omega_{Null2}^2 + \\ (\omega_{Null1}^2 + \omega_{Null2}^2)\omega_1^2 + \omega_1^4\end{array}\right)}{\omega_{Null1}^2\omega_{Null2}^2} \qquad \text{(Equation 39)}$$

$$a_2 = \frac{-20D\omega_1\left(\begin{array}{c}\omega_{Null1}^2\omega_{Null2}^2 + 4(\omega_{Null1}^2 + \omega_{Null2}^2) \\ \omega_1^2 + 16\omega_1^4\end{array}\right)}{\omega_{Null1}^2\omega_{Null2}^2}$$

$$a_3 = \frac{30D\omega_1\left(\begin{array}{c}\omega_{Null1}^2\omega_{Null2}^2 + 9(\omega_{Null1}^2 + \omega_{Null2}^2) \\ \omega_1^2 + 81\omega_1^4\end{array}\right)}{\omega_{Null1}^2\omega_{Null2}^2}$$

$$a_4 = \frac{-20D\omega_1\left(\begin{array}{c}\omega_{Null1}^2\omega_{Null2}^2 + 16(\omega_{Null1}^2 + \omega_{Null2}^2) \\ \omega_1^2 + 256\omega_1^4\end{array}\right)}{\omega_{Null1}^2\omega_{Null2}^2}$$

$$a_5 = \frac{5\omega_1\left(\begin{array}{c}\omega_{Null1}^2\omega_{Null2}^2 + 25(\omega_{Null1}^2 + \omega_{Null2}^2) \\ \omega_1^2 + 625\omega_1^4\end{array}\right)}{\omega_{Null1}^2\omega_{Null2}^2}$$

If, as an example, the values of the configuration elements in a discrete time direct sampling circuit with a quintuple-parallelism configuration are derived assuming the conditions shown in Equation (40), circuit element values such as shown in Equation (41) are obtained.

[40]

$$\begin{cases} f_1 = \omega_1/2\pi = 1.0 \text{ MHz} \\ f_2 = \omega_2/2\pi = 2\omega_1/2\pi = 2.0 \text{ MHz} \\ f_3 = \omega_3/2\pi = 3\omega_1/2\pi = 3.0 \text{ MHz} \\ f_4 = \omega_4/2\pi = 4\omega_1/2\pi = 4.0 \text{ MHz} \\ f_5 = \omega_5/2\pi = 5\omega_1/2\pi = 5.0 \text{ MHz} \\ f_{Null1} = \frac{\omega_{Null1}}{2\pi} = 4 \text{ MHz} \\ f_{Null2} = \frac{\omega_{Null2}}{2\pi} = 8 \text{ MHz} \\ a_1 = 3.390 \times 10^8 \\ a_2 = -1.669 \times 10^9 \\ a_3 = 3.359 \times 10^9 \\ a_4 = -3.142 \times 10^9 \\ a_5 = .1119 \times 10^9 \\ f_s = 1/T_s = 2400 \text{ MHz} \\ M = 4 \\ C_{R1} = C_{R2} = C_{R3} = C_{R4} = C_{R5} = 0.2 \text{ pF} \end{cases} \qquad \text{(Equation 40)}$$

[41]

$$\begin{cases} gm_1 = 10.17 \text{ mS} \\ gm_2 = -25.03 \text{ mS} \\ gm_3 = 33.59 \text{ mS} \\ gm_4 = -23.56 \text{ mS} \\ gm_5 = 6.717 \text{ mS} \\ C_{H1} = 19.10 \text{ pF} \\ C_{H2} = 9.549 \text{ pF} \\ C_{H3} = 6.366 \text{ pF} \\ C_{H4} = 4.775 \text{ pF} \\ C_{H5} = 3.820 \text{ pF} \end{cases} \qquad \text{(Equation 41)}$$

Figure 13:
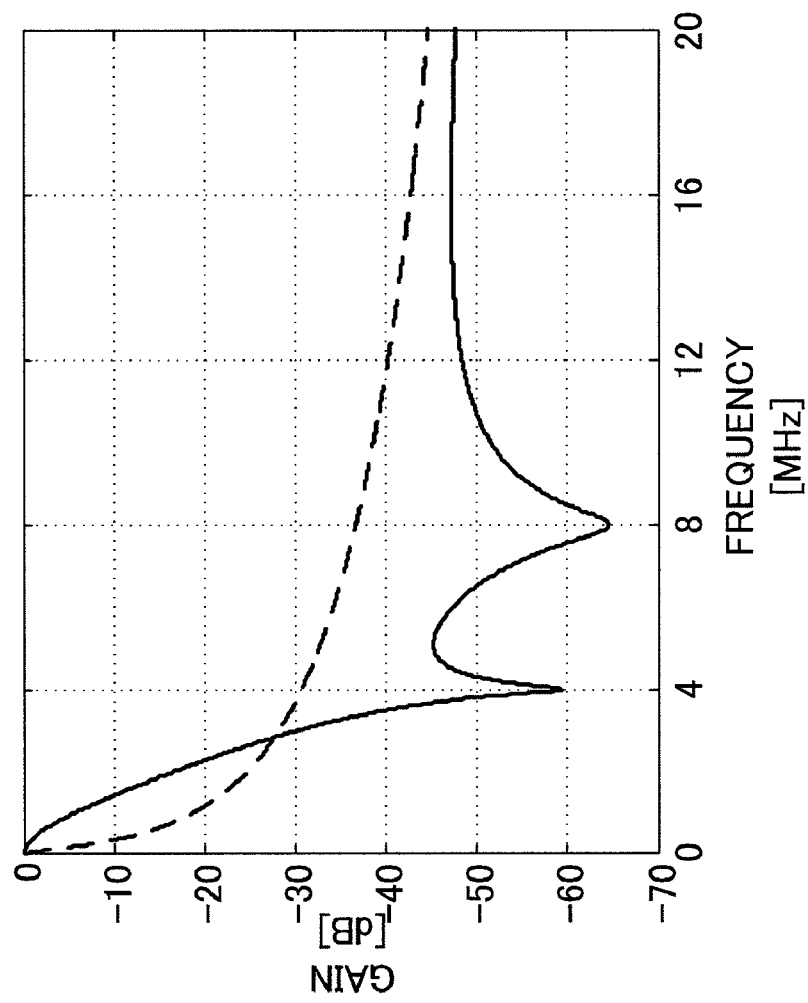
FIG. 13 is a characteristic graph showing an example of a third IIR filter characteristic realized by Embodiment 4.

FIG. 13 is a graph showing a third IIR filter characteristic realized by means of the conditions shown in Equation (40), this characteristic being indicated by the solid line. On the other hand, as an example for comparison, the dotted line in FIG. 13 is a frequency response characteristic when a configuration with only a single discrete time analog processing circuit system is employed, the configuration being such that the DC gain and high-frequency-region attenuation amount are equal. From FIG. 13, it can be confirmed that, by using a configuration with five systems in parallel, as compared with a configuration employing only a single discrete time analog processing circuit system in the conventional manner, gain fluctuation in a passing frequency region is reduced, there are attenuation poles at the two frequency positions of 4 MHz and 8 MHz, and it is possible to achieve a greater amount of attenuation in the surrounding frequency regions.

As described above, according to the configuration and operation of this embodiment, by connecting five discrete time analog processing circuit systems in parallel, and using a circuit configuration whereby charge signals obtained by each system are combined by buffer capacitor 102, it is possible for a characteristic of an IIR filter realized in a discrete time direct sampling circuit to be made equivalently high-dimensional.

In addition, by setting element values so as to satisfy the kind of conditions described above, in particular, it is possible to realize a characteristic having two attenuation poles on the frequency axis. Specifically, by setting element values so that the imaginary part of the numerator becomes 0 and the real part of the numerator becomes 0 at two frequencies in the transfer function (that is, Equation (33)) of an IIR filter characteristic realized by connecting five discrete time analog processing circuits in parallel, it becomes possible to realize a low-pass filter characteristic having two attenuation poles on the frequency axis.

In this embodiment, a case has been shown in which $\omega_1$ through $\omega_5$ are set in the kind of relationship shown in Equation (38), but the present invention is not limited to this case, and $\omega_1$ through $\omega_5$ may also be set in the kind of relationship shown in Equation (42), for example.

[42]

$$\omega_2=2\omega_1, \omega_3=4\omega_1, \omega_4=8\omega_1, \omega_5=16\omega_1 \quad \text{(Equation 42)}$$

In this case, if the values of the configuration elements are derived assuming the conditions shown in Equation (43), circuit element values such as shown in Equation (44) are obtained.

[43]

$$\begin{cases} f_1 = \omega_1/2\pi = 0.8 \text{ MHz} \\ f_2 = \omega_2/2\pi = 2\omega_1/2\pi = 1.6 \text{ MHz} \\ f_3 = \omega_3/2\pi = 4\omega_1/2\pi = 3.2 \text{ MHz} \\ f_4 = \omega_4/2\pi = 8\omega_1/2\pi = 6.4 \text{ MHz} \\ f_5 = \omega_5/2\pi = 16\omega_1/2\pi = 12.8 \text{ MHz} \\ f_{Null1} = \dfrac{\omega_{Null1}}{2\pi} = 3 \text{ MHz} \\ f_{Null2} = \dfrac{\omega_{Null2}}{2\pi} = 6 \text{ MHz} \\ a_1 = 1.124 \times 10^9 \\ a_2 = -2.660 \times 10^9 \\ a_3 = 3.096 \times 10^9 \\ a_4 = -2.868 \times 10^9 \\ a_5 = 1.717 \times 10^9 \\ f_s = 1/T_s = 472.5 \text{ MHz} \\ M = 4 \\ C_{R1} = C_{R2} = C_{R3} = C_{R4} = C_{R5} = 0.2 \text{ pF} \end{cases} \quad \text{(Equation 43)}$$

[44]

$$\begin{cases} gm_1 = 8.298 \text{ mS} \\ gm_2 = -9.818 \text{ mS} \\ gm_3 = 5.715 \text{ mS} \\ gm_4 = -2.646 \text{ mS} \\ gm_5 = 0.7924 \text{ mS} \\ C_{H1} = 4.700 \text{ pF} \\ C_{H2} = 2.350 \text{ pF} \\ C_{H3} = 1.175 \text{ pF} \\ C_{H4} = 0.5875 \text{ pF} \\ C_{H5} = 0.2938 \text{ pF} \end{cases} \quad \text{(Equation 44)}$$

Figure 14:
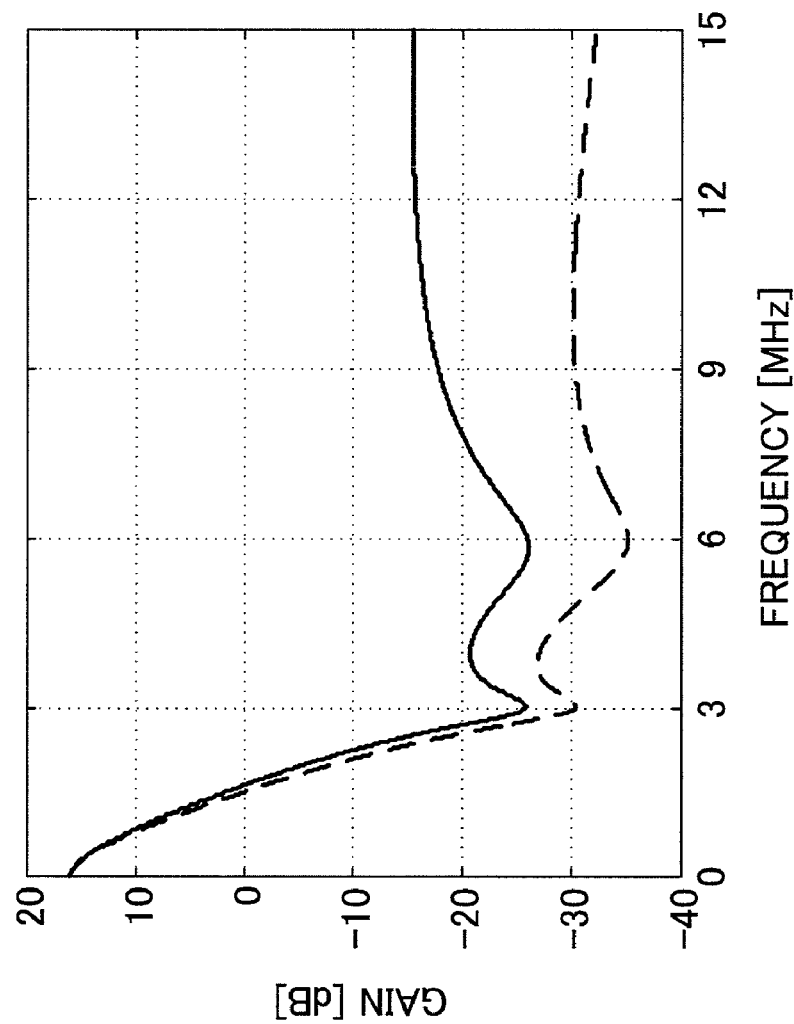
FIG. 14 is a characteristic graph showing another example of a third IIR filter characteristic realized by Embodiment 4, and an example of a filter overall characteristic realized by an overall discrete time direct sampling circuit.

FIG. 14 is a graph showing a third IIR filter characteristic realized by means of the conditions shown in Equation (43), this characteristic being indicated by the solid line. On the other hand, as an example for comparison, the dotted line in FIG. 14 shows a filter total characteristic when the overall discrete time direct sampling circuit operates under the condition N=1 (specifically, when N=1 in Equation (5)). From FIG. 14, it can be confirmed that a different filter characteristic can be realized by setting $\omega_1$ through $\omega_5$ in another relationship.

In Embodiment 3 and Embodiment 4, configuration examples have been shown for cases in which an odd number of ($2n+1$) discrete time analog processing circuit systems are provided. In particular, it has been shown that it is possible to realize a low-pass filter characteristic having n attenuation poles by imposing predetermined conditions on circuit element values. That is to say, by setting element values so that the imaginary part of the numerator becomes 0 and the real part of the numerator becomes 0 at n frequencies in the transfer function of an IIR filter characteristic realized by connecting ($2n+1$) discrete time analog processing circuits in parallel, it becomes possible to realize a low-pass filter characteristic having n attenuation poles on the frequency axis.

The present invention is not limited to only the configuration examples shown in Embodiment 3 and Embodiment 4, and in this embodiment, for example, if, instead of imposing the conditions shown in Equation (35) and Equation (36), element values are set so that the real part of the numerator in the transfer function of Equation (33) is 0, and the imaginary part is 0 at a specified frequency, one of the n attenuation poles can be made DC ($\omega_{Null1}$=0), and it becomes possible to realize a band-pass filter characteristic. In this case; a greater amount of attenuation can be achieved in a high-frequency region than when element values are set so as to create a low-pass filter.

Embodiment 5

In this embodiment, an example of realization of a desired filter characteristic when quadruple-parallelism is used is described as an example of a case in which the number of parallel systems in the parallel configuration of discrete time analog processing circuits shown in Embodiment 1 is an even number of four or more. In this embodiment, also, appropriate configuration conditions for this case are presented.

The overall configuration of a discrete time direct sampling circuit according to this embodiment is based on the generalized circuit configuration and control signals shown using FIG. 4 and FIG. 5 in Embodiment 1, and can be realized by those skilled in the art using the same kind of concept as illustrated in concrete terms as a triple-parallelism configuration example in Embodiment 3, and therefore illustrations and descriptions of the configuration elements are omitted.

Of the filter characteristics realized by a discrete time direct sampling circuit in which four discrete time analog processing circuit systems are connected in parallel, the frequency response characteristic of a corresponding part of a third IIR filter is expressed by an angular frequency ω function as shown in Equation (45)

[45]

$$H''_{IIR3}(\omega) = \sum_{k=1}^{4} \frac{a_k}{\omega_k + j\omega} = \frac{N_1\omega^2 + N_2 + j\omega(N_3\omega^2 + N_4)}{(\omega_1 + j\omega)(\omega_2 + j\omega)(\omega_3 + j\omega)(\omega_4 + j\omega)} \quad \text{(Equation 45)}$$

Here, in Equation (45), N1 through N4 are introduced to make the expression clearer, the expression actually being as shown in Equation (46).

[46]

$$N_1 = -a_1(\omega_2+\omega_3+\omega_4) - a_2(\omega_1+\omega_3+\omega_4) - a_3(\omega_1+\omega_2+\omega_4) - a_4(\omega_1+\omega_2+\omega_3)$$

$$N_2 = a_1\omega_2\omega_3\omega_4 + a_2\omega_1\omega_3\omega_4 + a_3\omega_1\omega_2\omega_4 + a_4\omega_1\omega_2\omega_3$$

$$N_3 = -(a_1+a_2+a_3+a_4)$$

$$N_4 = a_1(\omega_2\omega_3+\omega_3\omega_4+\omega_4\omega_2) + a_2(\omega_1\omega_3+\omega_3\omega_4+\omega_4\omega_1) + a_3(\omega_1\omega_2+\omega_2\omega_4+\omega_4\omega_1) + a_4(\omega_1\omega_2+\omega_2\omega_3+\omega_3\omega_1) \quad \text{(Equation 46)}$$

When the conditions in Equation (47) and Equation (48) below are both satisfied in Equation (45), the filter characteristic has one attenuation pole. That is to say, first, provision is made for the condition in Equation (47) to be satisfied in order to make the imaginary part of the numerator 0 in Equation (45).

[47]

$$N_3 = N_4 = 0 \quad \text{(Equation 47)}$$

Also, if the angular frequency position of the attenuation pole is $\omega_{Null}$, provision is made for the condition in equation (48) to be satisfied in order to make the real part of the numerator 0.

[48]

$$\omega_{Null1}^2 = -\frac{N_2}{N_1} \quad \text{(Equation 48)}$$

Here, if DC gain in the third IIR filter is designated D, Equation (49) can be obtained from Equation (45).

[49]

$$\frac{b_1}{\omega_1} + \frac{b_2}{\omega_2} + \frac{b_3}{\omega_3} + \frac{b_4}{\omega_4} = D \quad \text{(Equation 49)}$$

Furthermore, if, as an example, settings are made as shown in Equation (50), functions $a_1$ through $a_4$ can be derived as shown in Equation (51).

[50]

$$\omega_2 = 2\omega_1,\ \omega_3 = 3\omega_1,\ \omega_4 = 4\omega_1 \quad \text{(Equation 50)}$$

[51]

$$a_1 = \frac{4D\omega_1(\omega_1^2 + \omega_{Null1}^2)}{\omega_{Null1}^2} \quad \text{(Equation 51)}$$

$$a_2 = -\frac{12D\omega_1(4\omega_1^2 + \omega_{Null1}^2)}{\omega_{Null1}^2}$$

$$a_3 = \frac{12D\omega_1(9\omega_1^2 + \omega_{Null1}^2)}{\omega_{Null1}^2}$$

$$a_4 = -\frac{4D\omega_1(16\omega_1^2 + \omega_{Null1}^2)}{\omega_{Null1}^2}$$

If, as an example, the values of the configuration elements in a discrete time direct sampling circuit with a quadruple-parallelism configuration are derived assuming the conditions shown in Equation (52), circuit element values such as shown in Equation (53) are obtained.

[52]

$$\begin{cases} f_1 = \omega_1/2\pi = 1.36 \text{ MHz} \\ f_2 = \omega_2/2\pi = 2\omega_1/2\pi = 2.72 \text{ MHz} \\ f_3 = \omega_3/2\pi = 3\omega_1/2\pi = 4.08 \text{ MHz} \\ f_4 = \omega_4/2\pi = 4\omega_1/2\pi = 5.44 \text{ MHz} \\ f_{Null1} = \frac{\omega_{Null1}}{2\pi} = 10.0 \text{ MHz} \\ a_1 = 4.250 \times 10^7 \\ a_2 = -2.668 \times 10^8 \\ a_3 = 4.296 \times 10^8 \\ a_4 = -2.092 \times 10^8 \\ f_s = 1/T_s = 2400 \text{ MHz} \\ M = 4 \\ C_{R1} = C_{R2} = C_{R3} = C_{R4} = 0.2 \text{ pF} \end{cases} \quad \text{(Equation 52)}$$

[53]

$$\begin{cases} gm_1 = 6.143 \text{ mS} \\ gm_2 = -9.717 \text{ mS} \\ gm_3 = 7.036 \text{ mS} \\ gm_4 = -1.954 \text{ mS} \\ C_{H1} = 14.04 \text{ pF} \\ C_{H2} = 7.022 \text{ pF} \\ C_{H3} = 4.681 \text{ pF} \\ C_{H5} = 3.511 \text{ pF} \end{cases} \quad \text{(Equation 53)}$$

Figure 15:
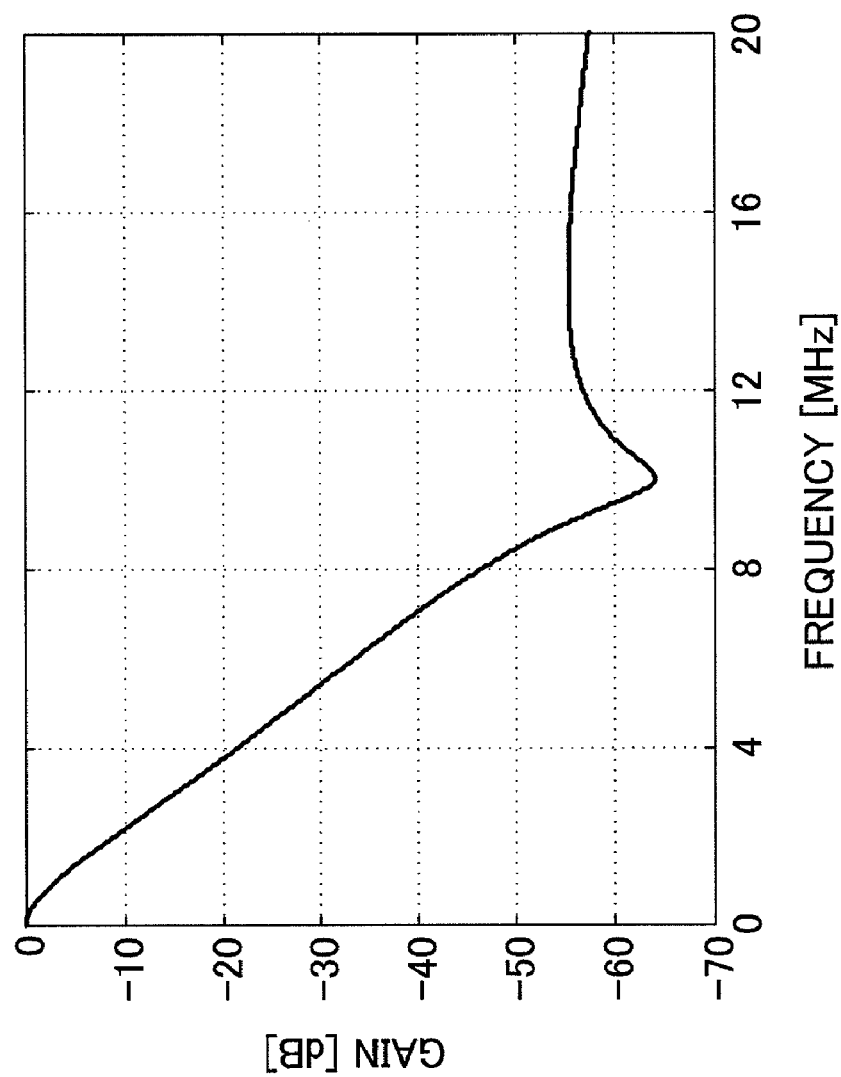
FIG. 15 is a characteristic graph showing an example of a third IIR filter characteristic realized by Embodiment 5.

FIG. 15 is a graph showing a third IIR filter characteristic realized by means of the conditions shown in Equation (52), this characteristic being indicated by the solid line. From FIG. 15, it can be confirmed that, by configuring four discrete time processing circuits in parallel, a filter characteristic can be realized that has one attenuation pole, and that enables a greater amount of attenuation to be achieved in the surrounding frequency regions.

As described above, according to the configuration and operation of this embodiment, by connecting four discrete time analog processing circuit systems in parallel, and using a circuit configuration whereby charge signals obtained by each system are combined by buffer capacitor 102, it is possible for a characteristic of an IIR filter realized in a discrete time direct sampling circuit to be made equivalently high-dimensional.

In addition, by setting element values so as to satisfy the kind of conditions described above, in particular, it is possible to realize a characteristic having one attenuation pole on the frequency axis. Specifically, by setting element values so that the imaginary part of the numerator becomes 0 and the real part of the numerator becomes 0 at one frequency in the transfer function (that is, Equation (45)) of an IIR filter characteristic realized by connecting four discrete time analog processing circuits in parallel, it becomes possible to realize a low-pass filter characteristic having one attenuation pole on the frequency axis.

In this embodiment, a case has been shown in which four discrete time analog processing circuits are connected in parallel, but the present invention is not limited to this case, and, essentially, when a ($2n+2$) even number of discrete time analog processing circuits are connected in parallel (where n is an integer greater than or equal to 1), if the circuit element values of the discrete time analog processing circuits are set to values such that the imaginary part of the numerator becomes 0 and the real part of the numerator becomes 0 at n frequencies in the transfer function of an IIR filter characteristic realized by connecting the discrete time analog processing circuits in parallel, it becomes possible to realize a low-pass filter characteristic having n attenuation poles.

The present invention is not limited to this configuration example, and in this embodiment, for example, if, instead of imposing the conditions shown in Equation (47) and Equation (48), element values are set so that the real part of the numerator in the transfer function of Equation (45) is 0, and the imaginary part is 0 at specified n frequencies, one of the n+1 attenuation poles becomes DC ($\omega_{Null1}=0$)—that is, it becomes possible to realize a band-pass filter characteristic. In this case, a greater amount of attenuation can be achieved in a high-frequency region than when element values are set so as to create a low-pass filter.

Figure 16:
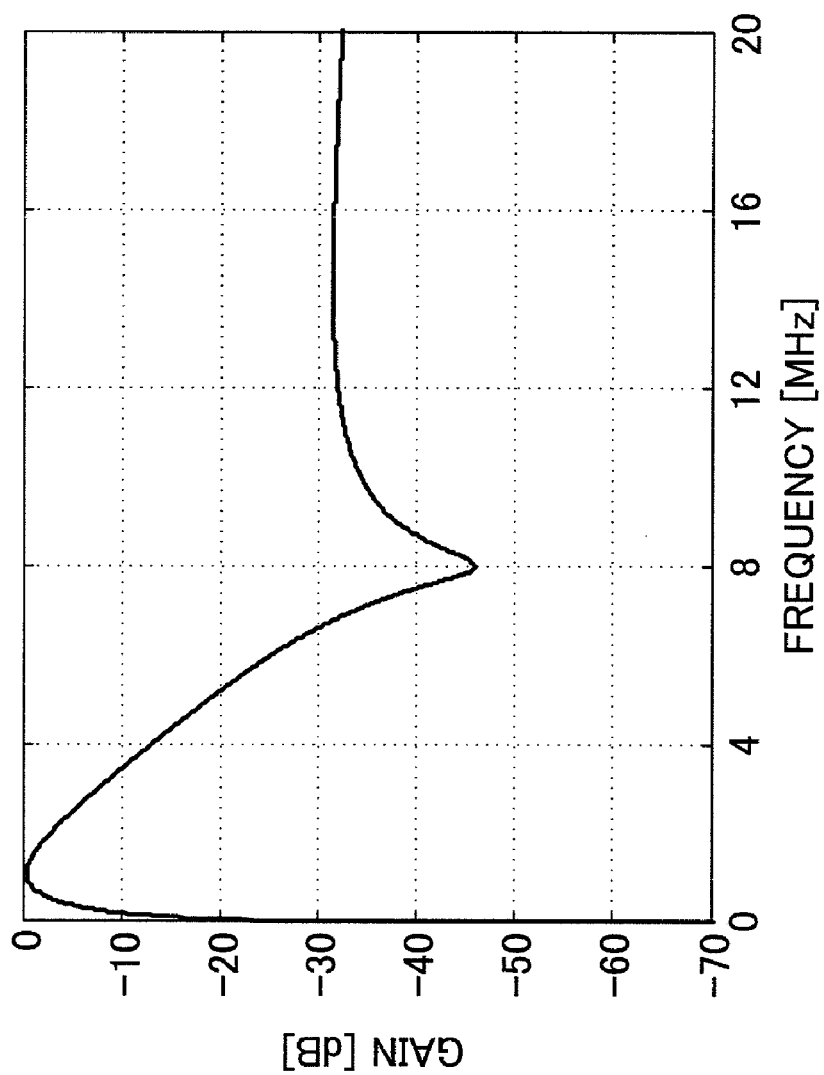
FIG. 16 is a characteristic graph showing another example of a third IIR filter characteristic realized by Embodiment 5.

FIG. 16 is a graph showing an example of a third IIR filter characteristic realized based on such conditions. From FIG. 16, it can be confirmed that a filter characteristic having attenuation poles at two places—DC (=0 Hz) and 8 MHz—can be realized by configuring four discrete time processing circuits in parallel.

Embodiment 6

In Embodiment 1 through Embodiment 5, cases have been shown in which a filter characteristic is realized by means of discrete time direct sampling circuits connected in parallel using the conversion expression shown in Equation (7) between s-region frequency response design and z-region discrete time processing circuit constant design values. In this embodiment, a case is described in which an s-region characteristic function is not used, and a filter characteristic is realized by using only a z-region expression.

In this embodiment, a case in which three discrete time analog processing circuits are used in parallel is taken as an example, as was the assumption in Embodiment 3; and an example of realization of the filter characteristic is presented together with appropriate configuration conditions for this case.

Of the filter characteristics realized by a discrete time direct sampling circuit in which three discrete time analog processing circuit systems are connected in parallel, the frequency response characteristic of a part corresponding to a third IIR filter is expressed in the z-region as shown in Equation (54)

[54]

$$H''_{IIR3}(z) = \sum_{k=1}^{n} \frac{MT_S a_k}{1 + MT_S \omega_k - z^{-M}} \quad \text{(Equation 54)}$$

$$= \frac{MT_S a_1}{1 + M\omega_1 T_S - z^{-M}} +$$

$$\frac{MT_S a_2}{1 + M\omega_2 T_S - z^{-M}} +$$

$$\frac{MT_S a_3}{1 + M\omega_3 T_S - z^{-M}}$$

If an angular frequency at which an attenuation pole is obtained is designated $\omega_N$ and used as shown in Equation (55), the numerator of Equation (54) for angular frequency $\omega_N$ can be written as shown in Equation (56).

[55]

$$\begin{cases} p_1 = \cos(2M\omega_N T_S) - 2\cos(M\omega_N T_S) + 1 \\ p_2 = M\omega_1 T_S(1 - \cos(M\omega_N T_S)) \\ p_3 = (M\omega_1 T_S)^2 \\ p_4 = \sin(2M\omega_N T_S) - 2\sin(M\omega_N T_S) \\ p_5 = -M\omega_1 T_S \sin(M\omega_N T_S) \end{cases} \quad \text{(Equation 55)}$$

[56]

$$MT_S\{(b_1+b_2+b_3)p_1+(b_1(\omega_2+\omega_3)+b_2(\omega_3+\omega_1)+b_3(\omega_1+\omega_2))p_2+(b_1\omega_2\omega_3+b_2\omega_3\omega_1+b_3\omega_1\omega_2)p_3\}+jMT_S\{(b_1+b_2+b_3)p_4+(b_1(\omega_2+\omega_3)+b_2(\omega_3+\omega_1)+b_3(\omega_1+\omega_2))p_5\} \quad \text{(Equation 56)}$$

Here, if it is assumed that the real part of the numerator is 0, the imaginary part of the numerator is 0, $\omega_2=2\omega_1$, and $\omega_3=3\omega_1$, and the DC gain is designated D, $a_1$, $a_2$, and $a_3$ are found as shown in Equation (57).

[57]

$$a_1 = \frac{D\omega_1 \begin{pmatrix} 9p_2p_4 - 9p_1p_5 + \\ 9p_3p_4\omega_1 + 9p_3p_5\omega_1^2 \end{pmatrix}}{3(p_2p_4 - p_1p_5)} \quad \text{(Equation 57)}$$

$$a_2 = \frac{-2D\omega_1 \begin{pmatrix} 9p_2p_4 - 9p_1p_5 + \\ 18p_3p_4\omega_1 + 36p_3p_5\omega_1^2 \end{pmatrix}}{3(p_2p_4 - p_1p_5)}$$

$$a_3 = \frac{3D\omega_1 \begin{pmatrix} p_2p_4 - p_1p_5 + \\ 3p_3p_4\omega_1 + 9p_3p_5\omega_1^2 \end{pmatrix}}{p_2p_4 - p_1p_5}$$

By substituting the values obtained by means of Equation (57) in Equation (58), the $C_{Hk}$ and $gm_k$ element values can be found, and the frequency response characteristic of the third IIR filter when these element values are used is expressed by Equation (59).

[58]

$$C_{Hk} = \frac{C_{Rk}}{MT_S\omega_k} \quad \text{(Equation 58)}$$

-continued $$gm_k = \frac{\pi a_k}{MT_S \omega_k} \times \left(\sum_{k=1}^{n} C_{Rk}\right)$$

[59]

$$H_{IIR3} = \left(\frac{MT_S}{\pi} \sum_{k=1}^{n} \frac{gm_k C_{Rk}/C_{Hk}}{1 + C_{Rk}/C_{Hk} - z^{-M}}\right) / \sum_{k=1}^{n} C_{Rk} \quad \text{(Equation 59)}$$

Figure 17:
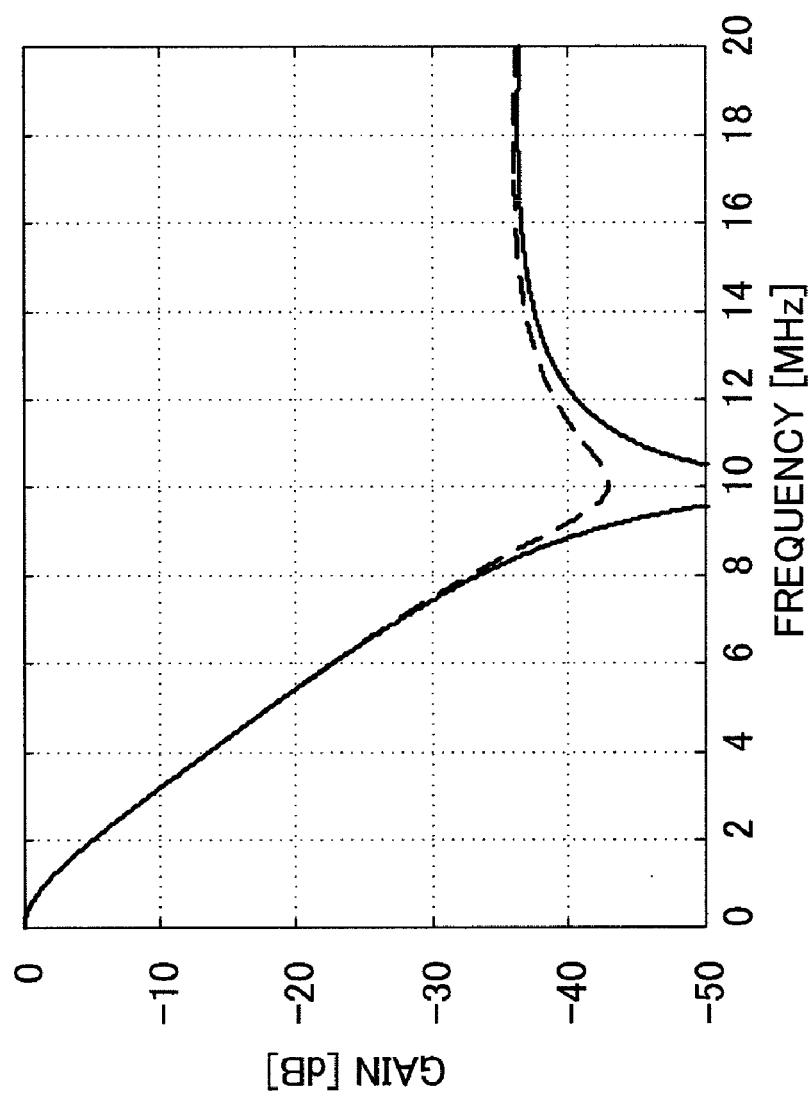
FIG. 17 is a graph comparing a third IIR filter characteristic (solid line) realized by Embodiment 6 and a third IIR filter characteristic (dotted line) realized by Embodiment 3.

FIG. 17 is a graph showing a frequency characteristic obtained by a design example in the case of triple-parallelism illustrated in Embodiment 3, together with a frequency characteristic obtained by means of the design method of this embodiment. In FIG. 17, the dotted line represents a characteristic obtained with the design method of Embodiment 3, and the solid line represents a characteristic obtained with the design method of this embodiment. From this graph, it can be confirmed that a greater amount of attenuation is obtained at a specified attenuation pole when the design method of this embodiment is used.

As described above, according to the configuration and operation of this embodiment, it is possible to achieve a greater amount of attenuation at a specified attenuation pole by calculating and using circuit constant values based on a z-region characteristic equation.

In this embodiment, a case has been shown in which the number of systems used in parallel in a discrete time direct sampling circuit is three, but the method of this embodiment is not limited to this degree of parallelism, and based on the content of the embodiments presented thus far, it goes without saying that the method of this embodiment can also easily be applied to cases in which the degree of parallelism is 4 or more, or 2.

Embodiment 7

In this embodiment, a case is presented in which the parallel discrete time analog processing circuit configuration shown in Embodiment 1 is realized by means of a differential configuration.

Figure 18:
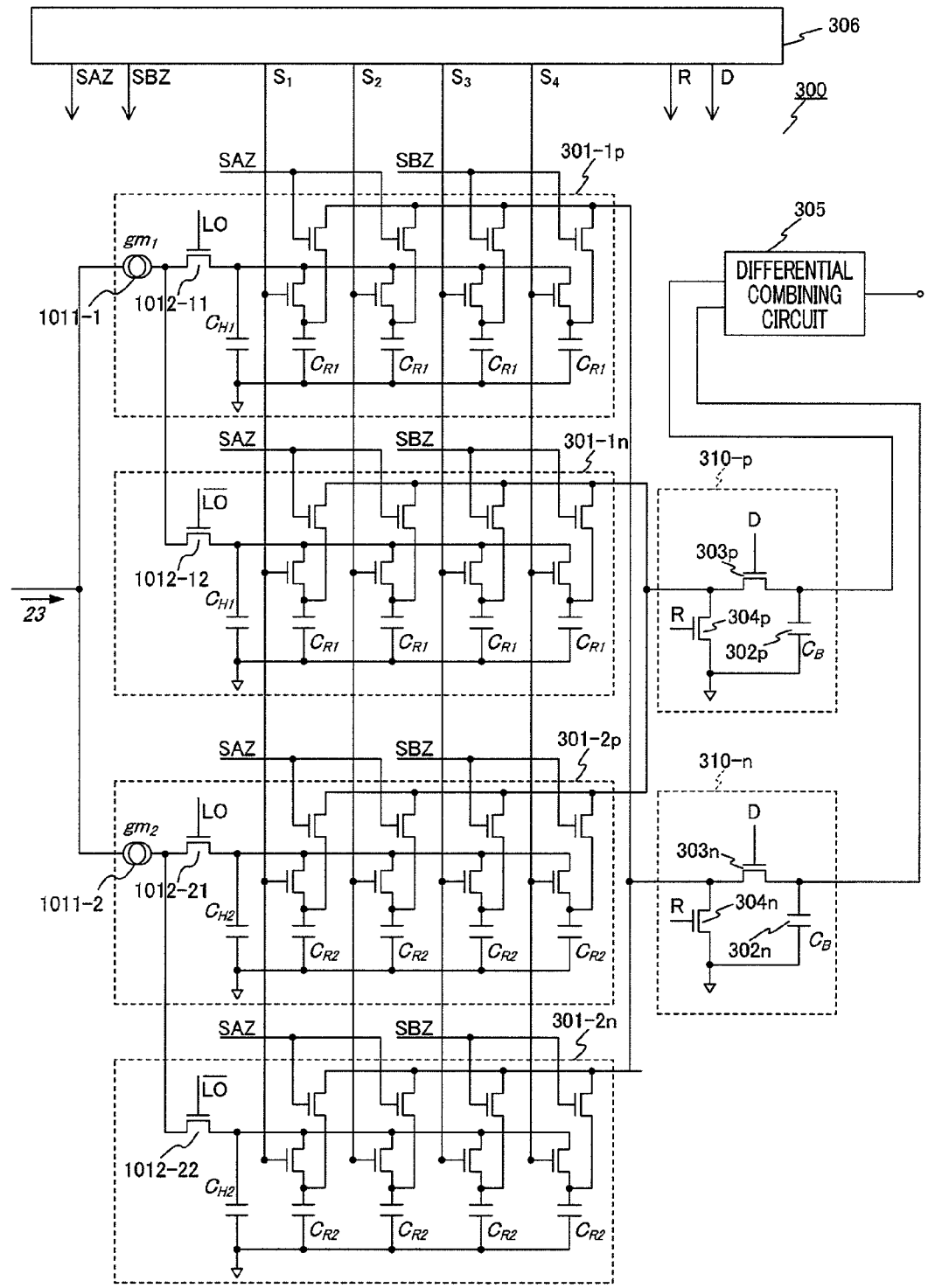
FIG. 18 is a connection diagram showing the configuration of a discrete time direct sampling circuit of Embodiment 7.

FIG. 18 shows the configuration of a discrete time direct sampling circuit of this embodiment. In brief, direct sampling circuit 300 has a configuration employing differential circuit operation of discrete time direct sampling circuits by means of dual-parallelism of discrete time analog processing circuits 301. The configuration of each discrete time analog processing circuit 301 is similar to that of discrete time analog processing circuit 101 shown in FIG. 7, and therefore a description thereof is omitted here. Also, to avoid making the drawing overly complex, reference codes for circuit elements other than those necessary for an explanation of this embodiment are omitted.

The configuration in FIG. 18 differs from that in FIG. 7 in that the discrete time analog processing circuits of each system perform differential operation, and in having circuits (namely, output sections 310-$p$ and 310-$n$) that combine the outputs of a plurality of parallel circuit systems for positive-phase and negative-phase outputs, and a circuit (namely, differential combining circuit 305) that combines the obtained two-phase signal outputs.

Specifically, in discrete time direct sampling circuit 300, each discrete time analog processing circuit system is provided with discrete time analog processing circuit 301-1$p$/301-2$p$ as a positive-phase-side operation circuit, and is also provided with discrete time analog processing circuit 301-1$n$/301-2$n$ as a negative-phase-side operation circuit.

Positive-phase discrete time analog processing circuit 301-1$p$ and negative-phase discrete time analog processing circuit 301-1$n$ share one voltage-to-current converter 1011-1. There is input to sampling switch 1012-12 of negative-phase discrete time analog processing circuit 301-1$n$ a local frequency signal whose phase is inverted with respect to that of local frequency signal LO input to sampling switch 1012-11 of positive-phase discrete time analog processing circuit 301-1$p$.

Similarly, positive-phase discrete time analog processing circuit 301-2$p$ and negative-phase discrete time analog processing circuit 301-2$n$ share one voltage-to-current converter 1011-2, and there is input to sampling switch 1012-22 of negative-phase discrete time analog processing circuit 301-2$n$ a local frequency signal whose phase is inverted with respect to that of local frequency signal LO input to sampling switch 1012-21 of positive-phase discrete time analog processing circuit 301-2$p$.

Discrete time direct sampling circuit 300 also has positive-phase-side processing output section 310-$p$ and negative-phase-side processing output section 310-$n$. The outputs of negative-phase discrete time analog processing circuit 301-1$n$ and positive-phase discrete time analog processing circuit 301-2$p$ are input to positive-phase-side processing output section 310-$p$. The outputs of positive-phase discrete time analog processing circuit 301-1$p$ and negative-phase discrete time analog processing circuit 301-2$n$ are input to negative-phase-side processing output section 310-$n$.

Discrete time direct sampling circuit 300 also has differential combining circuit 305, and by means of this differential combining circuit 305 performs differential combining of signals accumulated in buffer capacitors 302$p$ and 302$n$ of output sections 310-$p$ and 310-$n$.

Figure 19:
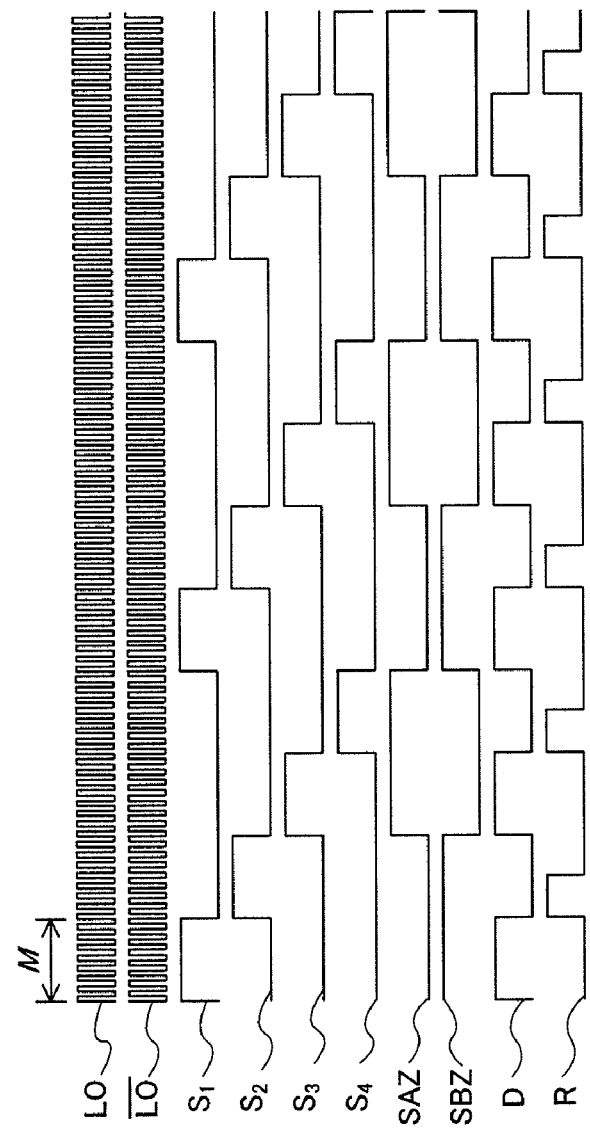
FIG. 19 is a timing chart provided to explain control signals of Embodiment 7.

FIG. 19 is a timing chart of control signals output from digital control unit 306 and local frequency signals supplied to sampling switch 1012 in this embodiment. The difference from the timing chart shown in FIG. 8 is that two signals with mutually inverted phases are used as local frequency signals.

The operation of parts in discrete time direct sampling circuit 300 configured as described above whose operation differs from that of the single-phase signal processing circuitry disclosed in Embodiment 2 will now be explained. In the following description, a case is assumed in which the same kind of conditions and circuit element values are used as in Embodiment 2.

With the circuit element values shown in Equation (17) in Embodiment 2, a negative gm value (transconductance) is set in the first discrete time analog processing circuit 301-1 system, and a positive gm value is set in the second discrete time analog processing circuit 301-2 system. A characteristic of this embodiment is that, in combining the outputs of a plurality of discrete time processing circuit systems whose gm value signs differ, output systems in a mutually inverse phase relationship are combined by a differential operation circuit.

That is to say, in the configuration shown in FIG. 18, as input for performing positive-phase output combining (that is, as output section 310-$p$ input), negative-phase-side circuit (that is, negative-phase discrete time analog processing circuit) 301-1$n$ output is connected for first discrete time analog processing circuit 301-1 for which a negative gm value is required, and positive-phase-side circuit (that is, positive-phase discrete time analog processing circuit) 301-2$p$ output is connected for second discrete time analog processing circuit 301-2 for which a positive gm value is required.

On the other hand, as input for performing negative-phase output combining (that is, as output section 310-*n* input), positive-phase-side circuit (that is, positive-phase discrete time analog processing circuit) 301-1*p* output is connected for first discrete time analog processing circuit 301-1 for which a negative gm value is required, and negative-phase-side circuit (that is, negative-phase discrete time analog processing circuit) 301-2*n* output is connected for second discrete time analog processing circuit 301-2 for which a positive gm value is required.

By means of these connection relationships, signals accumulated in respective positive-phase-side and negative-phase-side buffer capacitors 302*p* and 302*n* ultimately undergo differential combining by differential combining circuit 305, and received signal output is thereby obtained.

As described above, according to this embodiment, the configuration of a discrete time direct sampling circuit is made a differential circuit configuration, and of parallelized plurality of discrete time analog processing circuits 301-1 and 301-2, inverse-side signals are connected to output sections 310-*p* and 310-*n* for system 301-1 for which a negative gm value is required as a gm value (transconductance) in voltage-to-current converter 1011.

Specifically, first and second discrete time analog processing circuits 301-1 and 301-2 composing a discrete time analog processing circuit group are provided with positive-phase discrete time analog processing circuits 301-1*p* and 301-2*p* and negative-phase discrete time analog processing circuits 301-1*n* and 301-2*n*, the outputs of positive-phase discrete time analog processing circuit 301-1*p* of first discrete time analog processing circuit 301-1 and negative-phase discrete time analog processing circuit 301-2*n* of second discrete time analog processing circuit 301-2 are input to negative-phase-side processing output section 310-*n*, and the outputs of negative-phase discrete time analog processing circuit 301-1*n* of first discrete time analog processing circuit 301-1 and positive-phase discrete time analog processing circuit 301-2*p* of second discrete time analog processing circuit 301-2 are input to positive-phase-side processing output section 310-*p*.

By this means, even when a positive gm value is used for voltage-to-current converter 1011-1, it is possible to perform processing equivalent to that when a negative gm value voltage-to-current converter is used, and use of a reverse-polarity voltage-to-current converter is rendered unnecessary. As a result, in discrete time direct sampling circuit 300 the configuration of voltage-to-current converter 1011-1 is simplified inasmuch as a reverse-polarity voltage-to-current converter need not be used.

Other Embodiments (1) In the configurations shown in Embodiments 1 through 6 above, a plurality of discrete time analog processing circuits including a voltage-to-current converter are connected in parallel, and it is possible to make a realized filter characteristic equivalently high-dimensional by combining the signals obtained by each system by means of buffer capacitor 102. Furthermore, embodiments have been shown that greatly improve the degree of design freedom by extending the circuit element values that can be set in determining a filter characteristic beyond the conventional single-system history capacitor, rotation capacitor, and buffer capacitor capacitance values to also include the capacitance values of the capacitors of a plurality of systems and the gm values of the voltage-to-current converters.

Figure 20:
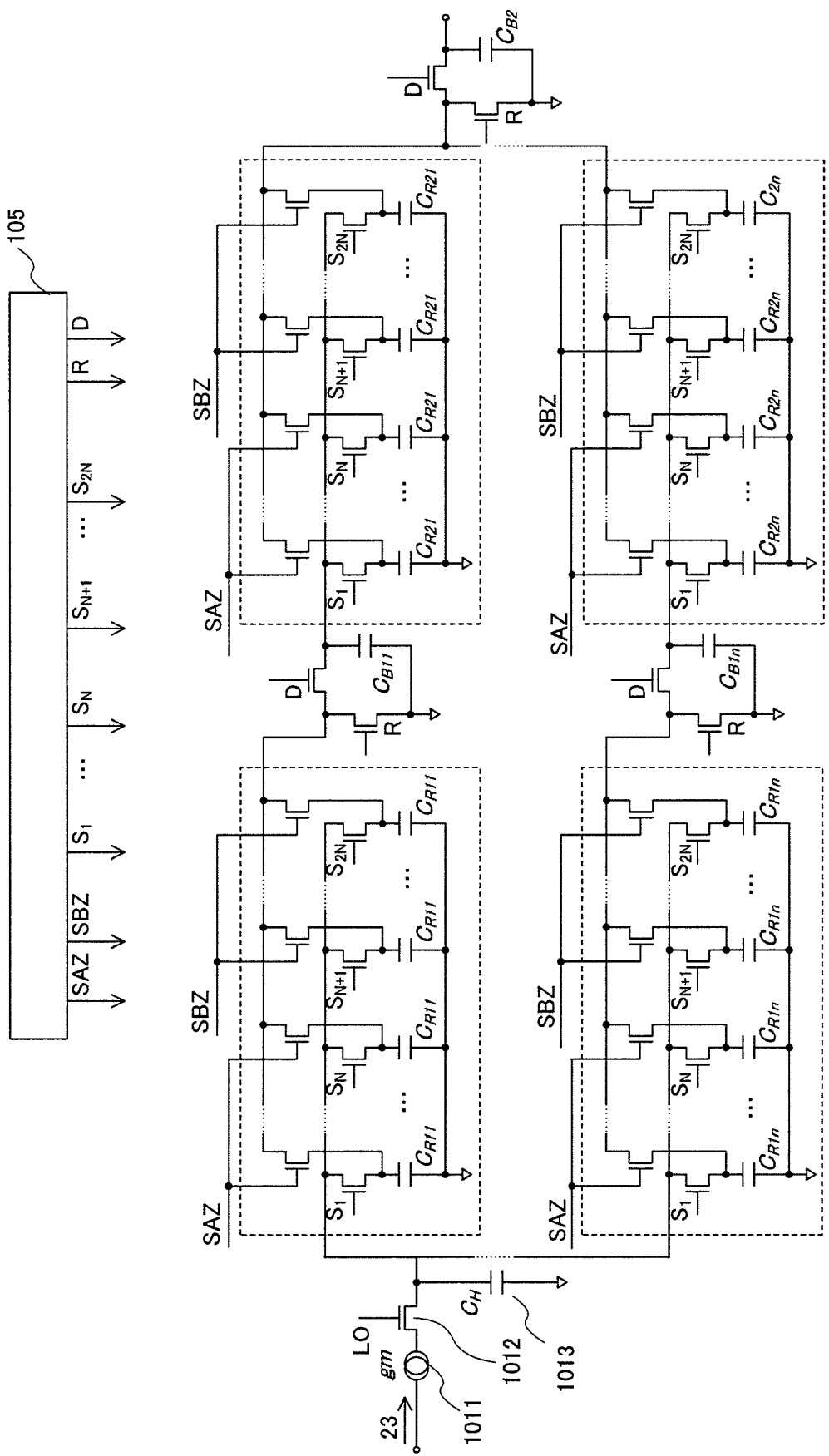
FIG. 20 is a connection diagram showing the configuration of a discrete time direct sampling circuit according to another embodiment.

The present invention is not limited to the above-described configuration examples, and it is possible to achieve high filter characteristic dimensionality and an improved degree of circuit design freedom by means of a configuration in which, as shown in FIG. 20 for example, there is only one voltage-to-current converter 1011, sampling switch 1012, and history capacitor 1013 for input, and later-stage rotation capacitor groups and buffer capacitor groups are connected in multiple-system parallelism and in series.

Figure 21:
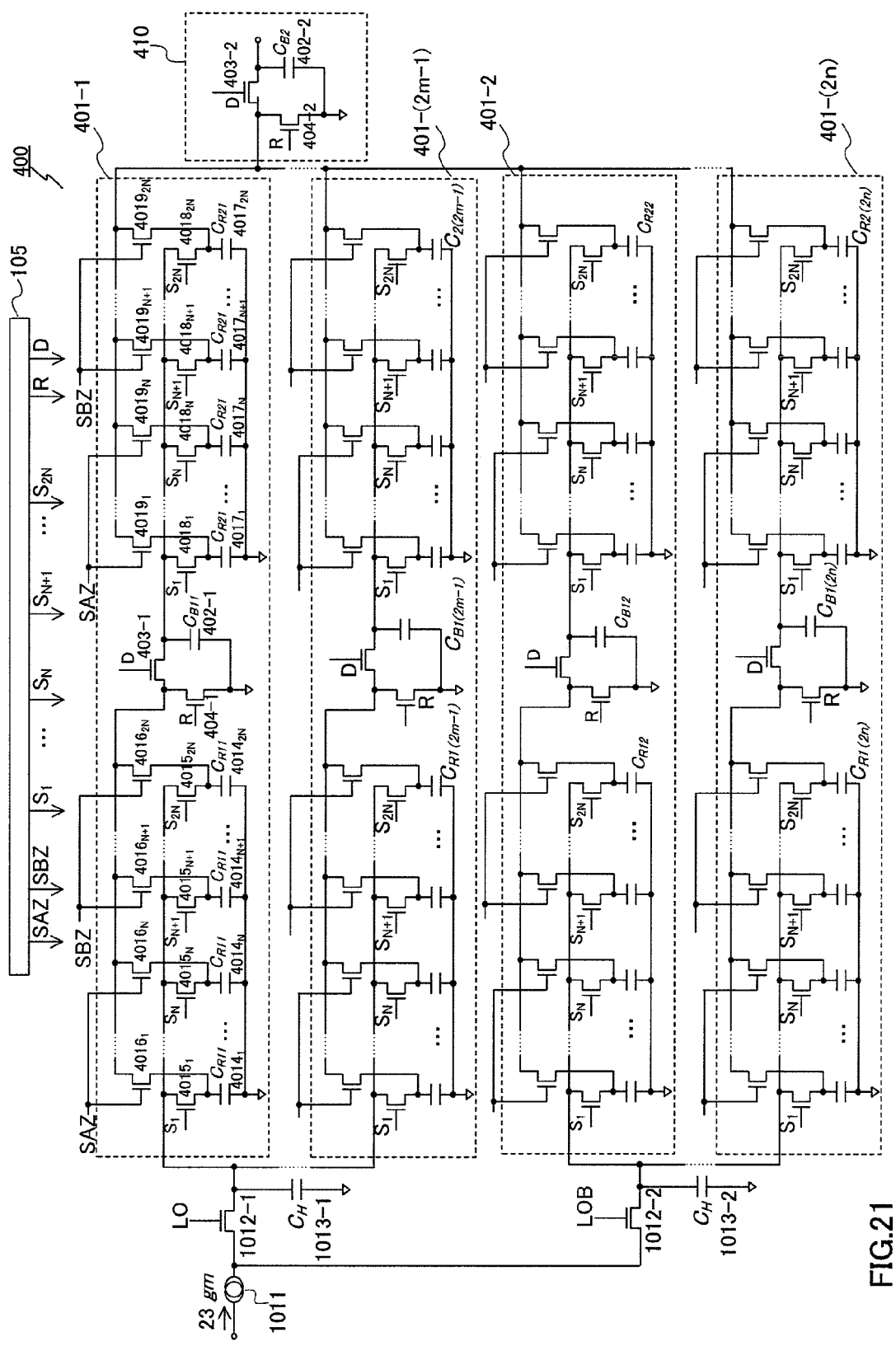
FIG. 21 is a connection diagram showing the configuration of a discrete time direct sampling circuit according to another embodiment.

(2) Also, a configuration may be used in which, as shown in FIG. 21, only one voltage-to-current converter 1011 is provided for input in the parallel configuration of discrete time analog processing circuits shown in Embodiment 1, and later-stage rotation capacitor groups and buffer capacitor groups are connected in series and provided as a plurality of parallel systems.

Discrete time direct sampling circuit 400 in FIG. 21 has a discrete time analog processing circuit group in which a plurality of discrete time analog processing circuit systems 401-1 through 401-(2*m*−1) and 401-2 through 401-(2*n*) are connected in parallel, voltage-to-current converter 1011, sampling switches 1012-1 and 1012-2, history capacitors 1013-1 and 1013-2, digital control unit 105, and output section 410. Items in FIG. 21 having the same configuration and operation as in FIG. 5 are assigned the same reference numbers as in FIG. 5, and descriptions thereof are omitted.

Discrete time analog processing circuits 401-1 through 401-(2*m*−1) and 401-2 through 401-(2*n*) respectively have rotation capacitor groups $4014_1$ through $4014_{2N}$ and $4017_1$ through $4017_{2N}$, integration switch groups $4015_1$ through $4015_{2N}$ and $4018_1$ through $4018_{2N}$, discharge switch groups $4016_1$ through $4016_{2N}$ and $4019_1$ through $4019_{2N}$, buffer capacitor 402-1, damping switch 403-1, and reset switch 404-1. In FIG. 21, to avoid making the drawing overly complex, reference codes are assigned only to configuration elements of discrete time analog processing circuit 401-1 among discrete time analog processing circuits 401-1 through 401-(2*m*−1) and 401-2 through 401-(2*n*), but the other discrete time analog processing circuits also have the same kind of configuration as discrete time analog processing circuit 401-1.

Here, capacitance values of rotation capacitor groups $4014_1$ through $4014_{2N}$ and $4017_1$ through $4017_{2N}$ of discrete time analog processing circuits 401-1 through 401-(2*m*−1) and 401-2 through 401-(2*n*), and buffer capacitor 402-1, are set to different values based on a derivative expression given later herein.

Output section 410 has buffer capacitor 402-2, damping switch 403-2, and reset switch 404-2. Digital control unit 105 sends the control signals shown in FIG. 6 to discrete time analog processing circuits 401-1 through 401-(2*m*−1) and 401-2 through 401-(2*n*), and output section 410.

Next, the filter operation of discrete time direct sampling circuit 400 of this embodiment will be described. First FIR filter and second FIR filter characteristics are the same kind of characteristics as in Embodiment 1, and are expressed by Equation (1) and Equation (2) respectively. The third FIR filter characteristic is determined by the number of capacitors, N, selected by control signal SAZ or SBZ from among rotation capacitors $4017_1$ through $4017_{2N}$, and the transfer function of the third FIR filter characteristic realized is expressed by Equation (60).

[60]

$$H_{\text{FIR3\_k}} = \frac{1 - z^{-M \times N \times N}}{1 - z^{-M \times N}} \qquad \text{(Equation 60)}$$

A fifth IIR filter is configured by performing charge sharing between history capacitors 1013-1 and 1013-2 and rotation capacitors $4014_1$ through $4014_{2N}$ of discrete time analog processing circuits 401-1 through 401-(2m−1) and 401-2 through 401-(2n). The transfer function of this fifth IIR filter characteristic can be expressed by Equation (61). In Equation (61), a gain term when a current signal is integrated and converted to a discrete charge amount is also included in the expression.

[61]

$$H_{\text{IIR5\_k}} = \frac{gmT_S}{\pi} \frac{\sum_{k=1}^{2n} C_{R1k}/C_H}{1 + \sum_{k=1}^{2n} C_{R1k}/C_H - z^{-M}} \frac{1}{\sum_{k=1}^{n} C_{R1k}} \quad \text{(Equation 61)}$$

A sixth IIR filter is configured by performing charge sharing between rotation capacitors $4014_1$ through $4014_{2N}$, buffer capacitor 402-1, and rotation capacitors $4017_1$ through $4017_{2N}$, in discrete time analog processing circuits 401-1 through 401-(2m−1). The transfer function of the sixth IIR filter characteristic in each of discrete time analog processing circuits 401-1 through 401-(2m−1) can be expressed by Equation (62). Similarly, a sixth IIR filter is also configured with discrete time analog processing circuits 401-2 through 401-(2n), and its transfer function can be expressed by Equation (63).

[62]

$$H_{\text{IIR6\_}(2k-1)} = \frac{NC_{R1(2k-1)}/C_{B1(2k-1)}}{1 + (NC_{R1(2k-1)} + C_{R2(2k-1)})/C_{B1(2k-1)} - z^{-M\times N}} \quad \text{(Equation 62)}$$

[63]

$$H_{\text{IIR6\_}(2k)} = \frac{NC_{R1(2k)}/C_{B1(2k)}}{1 + (NC_{R1(2k)} + C_{R2(2k)})/C_{B1(2k)} - z^{-M\times N}} \quad \text{(Equation 63)}$$

A seventh IIR filter is configured by performing charge sharing between rotation capacitors $4017_1$ through $4017_{2N}$ in discrete time analog processing circuits 401-1 through 401-(2m−1) and 401-2 through 401-(2n), and buffer capacitor 402-2 of output section 410. The transfer function of the characteristics of the sixth IIR filter to seventh IIR filter can be expressed by Equation (64), using third FIR filter characteristic transfer function Equation (60) and sixth IIR filter characteristic transfer functions Equation (62) and Equation (63). At this time, discrete time analog processing circuits 401-2 through 401-(2n) expressed by Equation (62) have a negative-phase signal in sampling switch 1012-2, and therefore the sign is negative in Equation (64).

[64]

$$H_{\text{IIR6\_IIR7}} = H_{\text{FIR3\_k}} \left( \sum_{k=1}^{m} H_{\text{IIR6\_}(2k-1)} C_{R2(2k-1)} - \sum_{k=1}^{m} H_{\text{IIR6\_}(2k)} C_{R2(2k)} \right) \quad \text{(Equation 64)}$$

$$\frac{1}{\sum_{k=1}^{n+m} NC_{R2k}} \frac{\sum_{k=1}^{m+n} NC_{R2k}/C_{B2}}{1 + \sum_{k=1}^{m+n} NC_{R2k}/C_{B2} - z^{-M\times N\times N}}$$

From the above, filter processing total transfer characteristic H(z) obtained by overall discrete time direct sampling circuit 400 shown by Equation (60) can be expressed as shown in Equation (65).

[65]

$$H(z) = H_{\text{FIR1\_k}} H_{\text{FIR2\_k}} H_{\text{FIR3\_k}} H_{\text{IIR5\_k}} H_{\text{IIR6\_IIR7}} \quad \text{(Equation 65)}$$

$$= \frac{1}{M}\frac{1}{N}\frac{1-z^{-M\times N\times N}}{1-z^{-1}} \frac{\sum_{k=1}^{m+n} C_{R1k}/C_H}{1 + \sum_{k=1}^{m+n} C_{R1k}/C_H - z^{-M}}$$

$$\frac{1}{\sum_{k=1}^{m+n} C_{R1k}} \frac{1}{\sum_{k=1}^{m+n} NC_{R2k}}$$

$$\left( \frac{\sum_{k=1}^{m+n} \frac{gmT_S}{\pi}(-1)^{k+1}}{\frac{NC_{R1k}C_{R2k}/C_{B1k}}{1+(NC_{R1k}+C_{R2k})/C_{B1k} - z^{-M\times N}}} \right)$$

$$\frac{\sum_{k=1}^{m+n} NC_{R2k}/C_{B2}}{1 + \sum_{k=1}^{m+n} NC_{R2k}/C_{B2} - z^{-M\times N\times N}}$$

$$= \frac{1}{M}\frac{1}{N}\frac{1-z^{-M\times N\times N}}{1-z^{-1}} \frac{\sum_{k=1}^{m+n} C_{R1k}/C_H}{1 + \sum_{k=1}^{m+n} C_{R1k}/C_H - z^{-M}}$$

$$H'_{\text{IIR6}} \frac{\sum_{k=1}^{m+n} NC_{R2k}/C_{B2}}{1 + \sum_{k=1}^{m+n} NC_{R2k}/C_{B2} - z^{-M\times N\times N}}$$

The important point here is that, in the transfer function expressed by Equation (65), a desired filter frequency response characteristic is not obtained even if circuit element values $C_{R1k}$, $C_{R2k}$, and $C_{B1k}$ in n circuit systems are simply set arbitrarily.

By comparing term $H'_{\text{IIR6}}$ in Equation (65) with $H''_{\text{IIR3}}$ in Equation (66) that expresses a first-order low-pass filter in the z-region, relational expressions such as shown in Equation (67) and Equation (68) hold true for the element values.

[66]

$$H''_{\text{IIR6}}(z) = \sum_{k=1}^{m+n} \frac{MNT_S a_k}{1 + MNT_S \omega_k - z^{-MN}} \quad \text{(Equation 66)}$$

[67]

$$\frac{NC_{R1k} + C_{R2k}}{C_{B1k}} = \omega_k MNT_S \quad \text{(Equation 67)}$$

[68]

$$(-1)^{k+1} \frac{gm\, NC_{R1k} C_{R2k}}{\pi\left(\sum_{k=1}^{n} C_{R1k}\right)\left(\sum_{k=1}^{n} NC_{R2k}\right)C_{B1k}} = a_k \quad \text{(Equation 68)}$$

Thus, if DC gain, an attenuation pole position, and so forth are set, and constants $a_k$ and $\omega_k$ are determined and substituted in Equation (67) and Equation (68), and furthermore $C_{R1k}$ is established, optimal values of $C_{R1k}$ and $C_{B1k}$ are found.

According to the above configuration and operation, by connecting a plurality of discrete time analog processing circuits 401-1 through 401-(2m−1) and 401-2 through 401-(2n) in parallel, and using a circuit configuration whereby charge signals obtained by respective discrete time analog processing circuits 401-1 through 401-(2m−1) and 401-2 through 401-(2n) are combined by buffer capacitor 402-2, it is possible for an IIR filter realized in a discrete time direct sampling circuit to be made high-dimensional. Furthermore, the types and number of circuit element values that can be set in realizing a filter characteristic increase, making it possible to greatly improve the degree of design freedom of a filter. In particular, by setting the number of discrete time analog processing circuit systems provided in parallel appropriately according to filter performance required by a receiver, it is possible to set the number of attenuation poles and their position on the frequency axis arbitrarily, and to realize a filter characteristic capable of handling wideband signal reception.

Also, according to this embodiment, optimal values of circuit elements of plurality of discrete time analog processing circuits 401-1 through 401-(2m−1) and 401-2 through 401-(2n) are determined so as to satisfy the relationships of Equation (67) and Equation (68).

As an example, assuming the conditions shown in Equation (69), if the values of the circuit elements in discrete time direct sampling circuit 400 are derived from Equation (67) and Equation (68) and the design method shown in Embodiment 6, the values shown in Equation (70) are obtained.

[69]

$$\begin{cases} m = 2 \\ n = 1 \\ M = 8 \\ N = 1 \\ f_1 = 2.5 \text{ MHz} \\ f_2 = 5.0 \text{ MHz} \\ f_3 = 7.5 \text{ MHz} \\ f_{null} = 5.0 \text{ MHz} \\ a_1 = 6.138 \times 10^7 \\ a_2 = -1.98 \times 10^8 \\ a_3 = 1.607 \times 10^8 \\ f_s = 2400 \text{ MHz} \\ C_{R11} = C_{R21} \\ C_{R12} = C_{R22} \\ C_{R13} = C_{R23} \end{cases} \quad \text{(Equation 69)}$$

[70]

$$\begin{cases} gm = 10 \text{ mS} \\ C_{R11} = C_{R21} = 0.112 \text{ pF} \\ C_{R12} = C_{R22} = 0.180 \text{ pF} \\ C_{R13} = C_{R23} = 0.0973 \text{ pF} \\ C_{B11} = 4.260 \text{ pF} \\ C_{B12} = 3.443 \text{ pF} \\ C_{B13} = 1.239 \text{ pF} \\ C_H = C_{B2} = 1.1153 \text{ pF} \end{cases} \quad \text{(Equation 70)}$$

Figure 22:
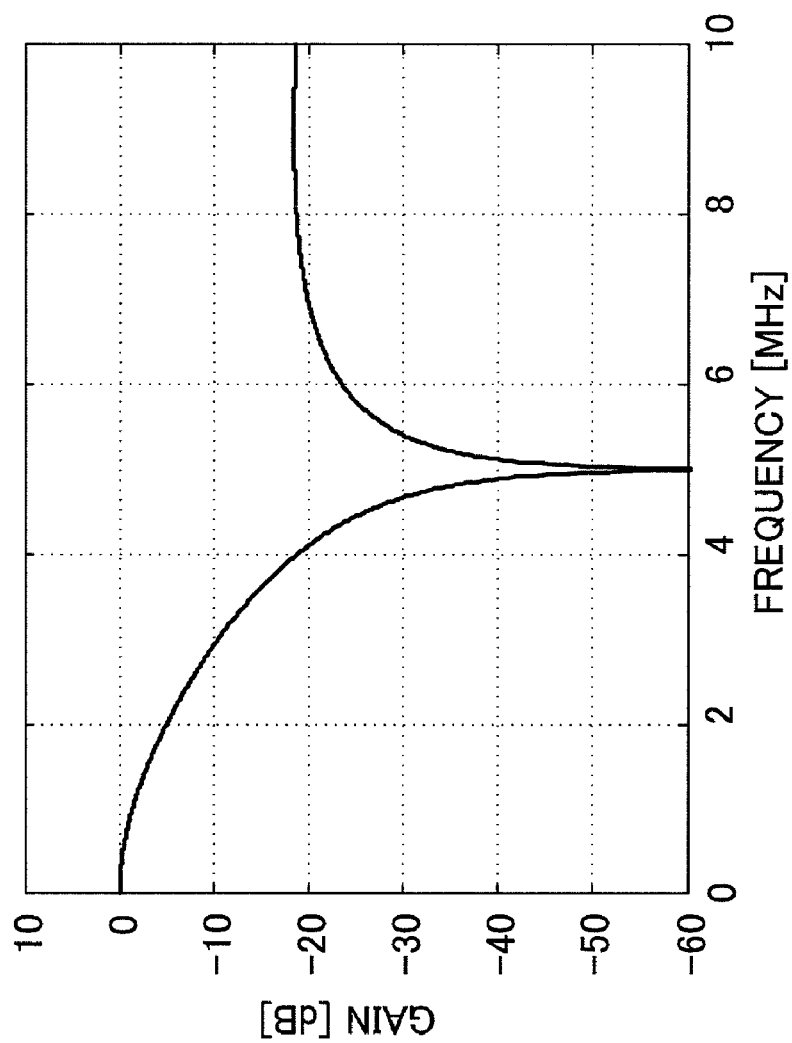
FIG. 22 is a characteristic graph showing a frequency characteristic of an overall circuit obtained when conditions and circuit element values are set as in another is embodiment in the discrete time direct sampling circuit in FIG. 21.

FIG. 22 is a characteristic graph showing a frequency characteristic obtained when the conditions shown in Equation (69) and circuit element values shown in Equation (70) are used in discrete time direct sampling circuit 400 shown in FIG. 21. From this graph it can be confirmed that, even though a single voltage-to-current converter system is used, the same kind of attenuation pole is obtained as with the discrete time sampling circuits shown in Embodiments 1 through 6. Also, using a single voltage-to-current converter system enables current dissipation to be suppressed.

(3) In Embodiments 1 through 6, cases have been assumed in which 2-stage sampling rate conversion rates represented by M and N are common between systems in the provided plurality of discrete time analog processing circuit systems, but the present invention is not limited to this. Specifically, it is only necessary for the conversion ratio of the sampling rates obtained in the two stages overall—that is, the value M×N— to be common, and therefore it is also possible for decimation ratios corresponding to M and N to be set independently on a system-by-system basis.

Also, in Embodiment 7, negative-phase signal synthesis is realized by synthesizing a signal in which the phase of a local signal supplied to a sampling switch has been inverted, but the present invention is not necessarily limited to this configuration and operation. For example, a configuration may also be used whereby combining is performed after directly generating a negative-phase signal using a balun or the like.

(4) In the configurations shown in Embodiments 1 through 7, and the configuration shown in other embodiment (2), an analog RF current signal output from a voltage-to-current converter is sampled by means of a sampling switch, but the voltage-to-current converter and sampling switch may also be switched around, with an RF signal sampled by the sampling switch being input to the voltage-to-current converter.

Figure 23:
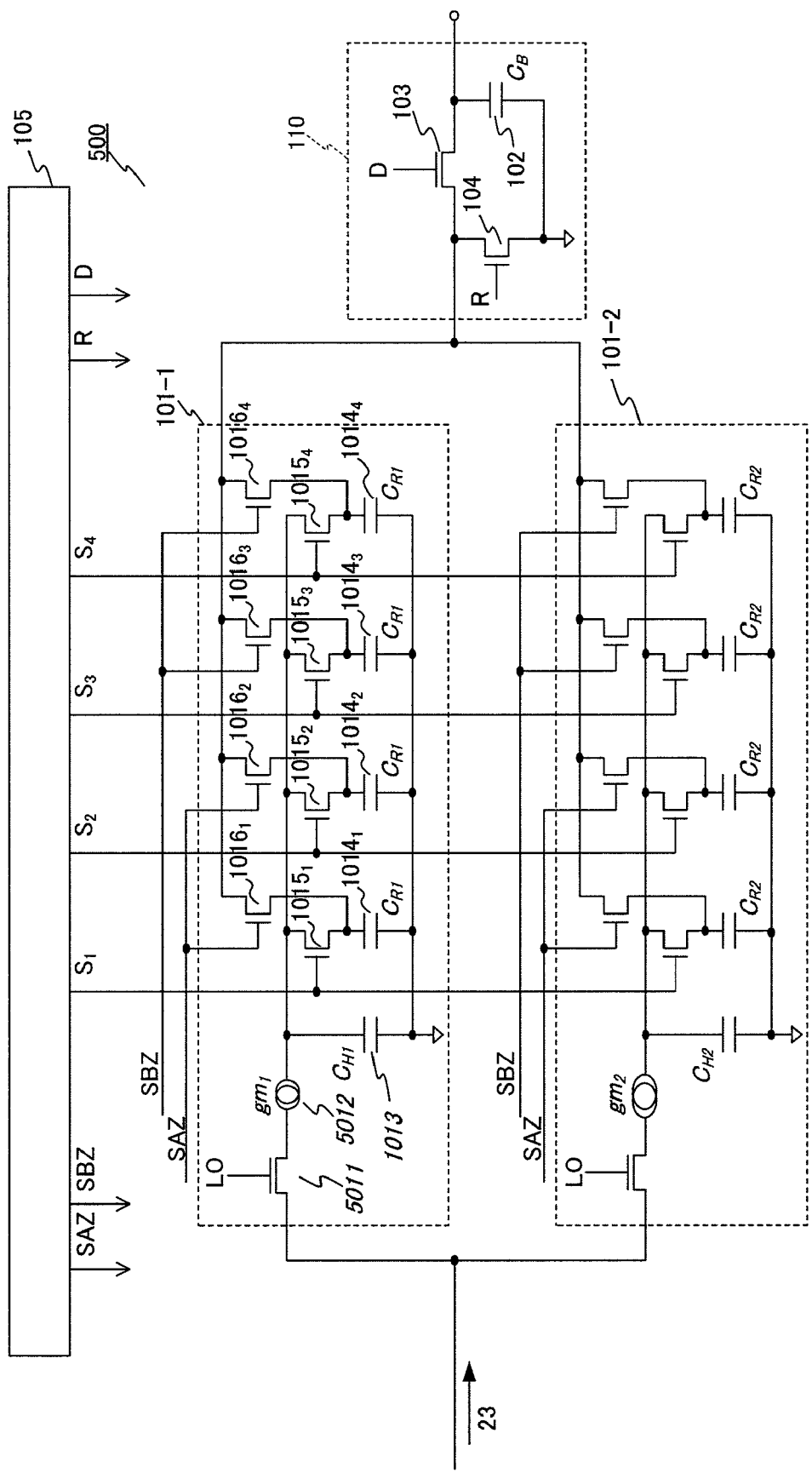
FIG. 23 is a connection diagram showing the configuration of a discrete time direct sampling circuit according to another embodiment.

Discrete time direct sampling circuit 500 shown in FIG. 23, in which parts corresponding to those in FIG. 5 are assigned the same reference codes as in FIG. 5, makes a realized filter characteristic equivalently high-dimensional, and makes an improvement in gain possible, by connecting a plurality of discrete time analog processing circuit 101 systems including a sampling switch 5011 and voltage-to-current converter 5012, with voltage-to-current converters 5012 having different gm values, and combining the signals obtained by the respective systems by means of buffer capacitor 102.

Figure 24:
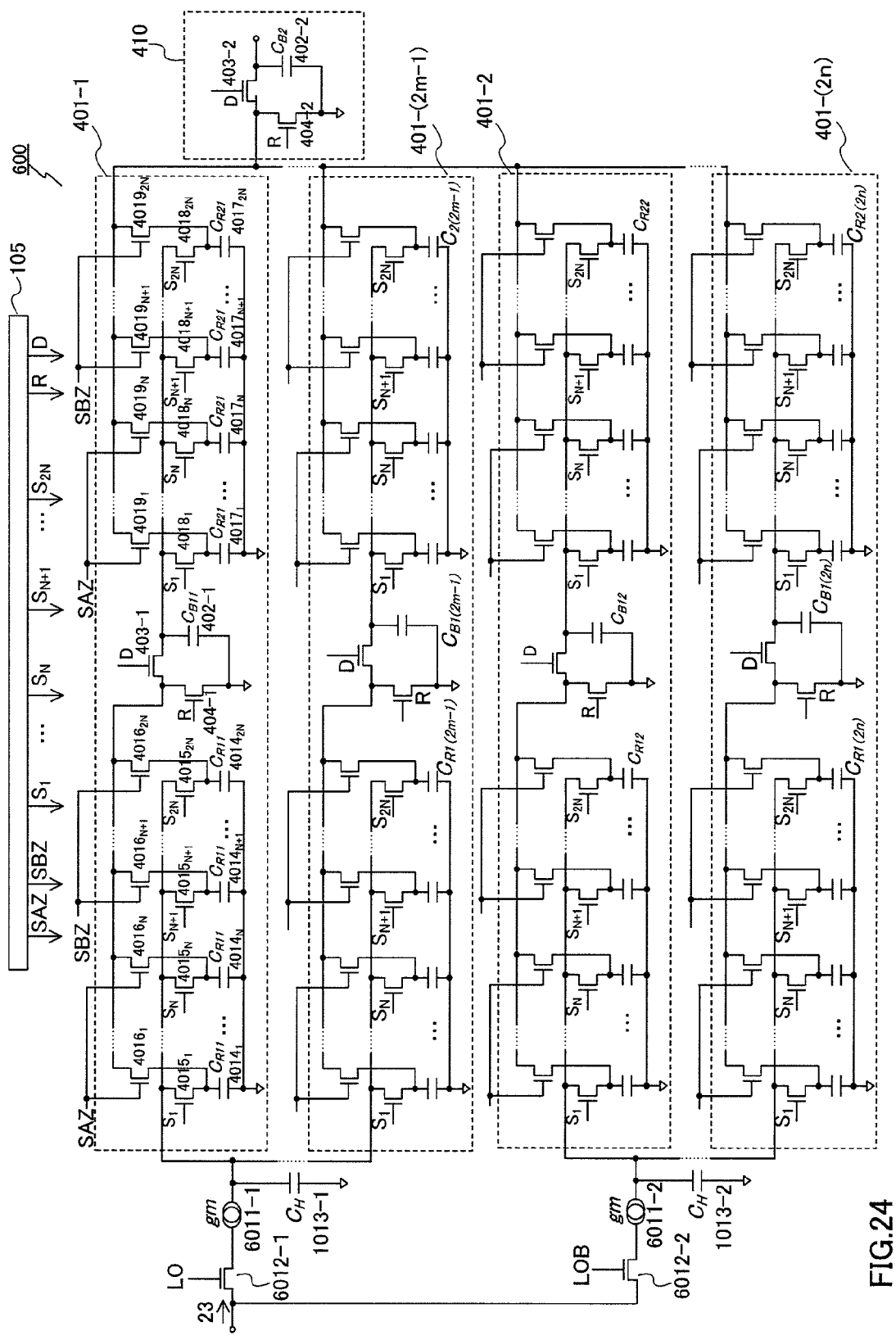
FIG. 24 is a connection diagram showing the configuration of a discrete time direct sampling circuit according to another embodiment.

Discrete time direct sampling circuit 600 shown in FIG. 24, in which parts corresponding to those in FIG. 21 are assigned the same reference codes as in FIG. 21, similarly makes a filter characteristic equivalently high-dimensional, and makes an improvement in gain possible, by means of a configuration in which one sampling switch 6012 and voltage-to-current converter 6011 system is provided for an LO signal, and one sampling switch 6012 and voltage-to-current converter 6011 system is provided for an LOB signal, with voltage-to-current converters 6011 having the same gm value, and the later-stage rotation capacitor groups and buffer capacitors are connected in multiple-system parallelism and in series.

The disclosures of Japanese Patent Application No. 2006-61914, filed on Mar. 7, 2006, Japanese Patent Application No. 2006-150511, filed on May 30, 2006, and Japanese Patent Application No. 2007-25745, filed on Feb. 5, 2007, including the specifications, drawings and abstracts, are incorporated herein by reference in their entirety.

INDUSTRIAL APPLICABILITY

A discrete time direct sampling circuit and receiver according to the present invention are suitable for use in a high-frequency signal processing circuit of a receiving section in a radio communication apparatus, and are effective when applied to a case in which signal frequency conversion and filter processing are performed.

The invention claimed is:

1. A discrete time direct sampling circuit, comprising:
a discrete time analog processing circuit group in which a plurality of discrete time analog processing circuits each having a first-order IIR (Infinite Impulse Response) filter characteristic are connected in parallel, each discrete time analog processing circuit comprising:
a voltage-to-current converter that converts an input analog RF signal to an analog RF current signal;
a sampling switch that performs sampling with a local frequency signal having a substantially same frequency as the analog RF current signal;
a history capacitor, a rotation capacitor group and an integration switch group that form discrete signals temporally discretized by integrating a charge of a sampling signal; and
a discharge switch group that performs on/off control of a discharge of charges from the rotation capacitor group;
an output section that is provided on an output side of the discrete time analog processing circuit group, the output section comprising a buffer capacitor and a first discharge switch that performs on/off control of a connection state of the plurality of discrete time analog processing circuits connected in parallel and the buffer capacitor; and
a digital controller that sends a control signal to each discrete time analog processing circuit and the output section.

2. The discrete time direct sampling circuit according to claim 1, wherein the discrete time analog processing circuit group comprises (2n+1) discrete time analog processing circuits, and an element value of each discrete time analog processing circuit that constitutes the discrete time analog processing circuit group is set such that, in a transfer function of the IIR filter characteristic, an imaginary part of a numerator is 0, and a real part of a numerator is 0 at n frequencies, where n is an integer greater than or equal to 1.

3. The discrete time direct sampling circuit according to claim 2, wherein the transfer function is determined by a value of a circuit element of the discrete time analog processing circuit.

4. The discrete time direct sampling circuit according to claim 1, wherein the discrete time analog processing circuit group comprises (2n+1) discrete time analog processing circuits, and an element value of each discrete time analog processing circuit that constitutes the discrete time analog processing circuit group is set such that, in a transfer function of the IIR filter characteristic, a real part of a numerator is 0, and an imaginary part of a numerator is 0 at n frequencies, where n is an integer greater than or equal to 1.

5. The discrete time direct sampling circuit according to claim 4, wherein the transfer function is determined by a value of a circuit element of the discrete time analog processing circuit.

6. The discrete time direct sampling circuit according to claim 1, wherein the discrete time analog processing circuit group comprises (2n+2) discrete time analog processing circuits, and an element value of each discrete time analog processing circuit that constitutes the discrete time analog processing circuit group is set such that, in a transfer function of the IIR filter characteristic, an imaginary part of a numerator is 0, and a real part of a numerator is 0 at n frequencies, where n is an integer greater than or equal to 1.

7. The discrete time direct sampling circuit according to claim 6, wherein the transfer function is determined by a value of a circuit element of the discrete time analog processing circuit.

8. The discrete time direct sampling circuit according to claim 1, wherein the discrete time analog processing circuit group comprises (2n+2) discrete time analog processing circuits, and an element value of each discrete time analog processing circuit that constitutes the discrete time analog processing circuit group is set such that, in a transfer function in which of the IIR filter characteristic, a real part of a numerator is 0, and an imaginary part of a numerator is 0 at n frequencies, where n is an integer greater than or equal to 1.

9. The discrete time direct sampling circuit according to claim 8, wherein the transfer function is determined by a value of a circuit element of the discrete time analog processing circuit.

10. The discrete time direct sampling circuit according to claim 1, wherein:
the discrete time analog processing circuit group comprises a first discrete time analog processing circuit and a second discrete time analog processing circuit, the first and second discrete time analog processing circuits each comprise:
a positive-phase discrete time analog processing circuit; and
a negative-phase discrete time analog processing circuit, and the output section comprises:
a first output section that inputs an output of the positive-phase discrete time analog processing circuit of the first discrete time analog processing circuit and an output of the negative-phase discrete time analog processing circuit of the second discrete time analog processing circuit; and
a second output section that inputs an output of the negative-phase discrete time analog processing circuit of the first discrete time analog processing circuit and an output of the positive-phase discrete time analog processing circuit of the second discrete time analog processing circuit.

11. The discrete time direct sampling circuit according to claim 1, wherein in each discrete time analog processing circuit of the discrete time analog processing circuit group,
the history capacitor charges or discharges a charge supplied by a current sampled by the sampling switch;
the rotation capacitor group is connected in parallel to the history capacitor and comprises a plurality of rotation capacitors that charge or discharge a charge;
the integration switch group is connected between the sampling switch and each rotation capacitor and performs on/off control of current to each rotation capacitor according to an integration control signal group from the digital controller; and the discharge switch group is connected between each rotation capacitor and the buffer capacitor and performs on/off control of discharge of charges from the rotation capacitor group to the buffer capacitor according to a discharge control signal group from the digital controller, and wherein the digital controller sends the integration control signal group and the discharge control signal group to each discrete time analog processing circuit of the discrete time analog processing circuit group.

12. The discrete time direct sampling circuit according to claim 11, wherein:

a capacitance value of the history capacitor of each discrete time analog processing circuit is set related to a ratio between a capacitance value of the rotation capacitor provided in each discrete time analog processing circuit and a cutoff frequency set value of each discrete time analog processing circuit; and transconductance of the voltage-to-current converter of each discrete time analog processing circuit is set related to a ratio between a sum of capacitance values of the rotation capacitor group of all discrete time analog processing circuits and a cutoff frequency set value of each of discrete time analog processing circuit.

13. The discrete time direct sampling circuit according to claim 1, comprising, instead of the voltage-to-current converter, the sampling switch, and the history capacitor that are possessed by each discrete time analog processing circuit of the discrete time analog processing circuit group, a voltage-to-current converter, a sampling switch, and a history capacitor that are shared by all discrete time analog processing circuits of the discrete time analog processing circuit group.

14. A receiver comprising the discrete time direct sampling circuit according to claim 1.

* * * * *

UNITED STATES PATENT AND TRADEMARK OFFICE
CERTIFICATE OF CORRECTION

| | | |
|---|---|---|
| PATENT NO. | : 8,229,987 B2 | Page 1 of 1 |
| APPLICATION NO. | : 12/281668 | |
| DATED | : July 24, 2012 | |
| INVENTOR(S) | : Y. Hosokawa et al. | |

It is certified that error appears in the above-identified patent and that said Letters Patent is hereby corrected as shown below:

At Column 36, line 26 (claim 8, line 7) of the printed patent, "in which" before --of-- should be deleted.

Signed and Sealed this
Second Day of October, 2012

David J. Kappos
*Director of the United States Patent and Trademark Office*